US012336123B2

(12) United States Patent
Hashimoto et al.

(10) Patent No.: US 12,336,123 B2
(45) Date of Patent: Jun. 17, 2025

(54) FOLDABLE DISPLAY DEVICE AND SUPPORTING ASSEMBLY THEREOF

(71) Applicant: E Ink Holdings Inc., Hsinchu (TW)

(72) Inventors: Keisuke Hashimoto, Hsinchu (TW); Kenji Nakazawa, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 387 days.

(21) Appl. No.: 18/155,741

(22) Filed: Jan. 18, 2023

(65) Prior Publication Data

US 2023/0240029 A1 Jul. 27, 2023

Related U.S. Application Data

(60) Provisional application No. 63/302,545, filed on Jan. 24, 2022.

(30) Foreign Application Priority Data

Dec. 15, 2022 (TW) .................................. 111148145

(51) Int. Cl.
*H05K 5/00* (2025.01)
*F16C 11/04* (2006.01)
*H05K 5/02* (2006.01)

(52) U.S. Cl.
CPC ............ *H05K 5/0226* (2013.01); *F16C 11/04* (2013.01)

(58) Field of Classification Search
CPC .............................. H05K 5/0226; F16C 11/04
See application file for complete search history.

(56) References Cited

U.S. PATENT DOCUMENTS

| 9,250,733 | B2 | 2/2016 | Lee et al. | |
| 11,425,831 | B2* | 8/2022 | Kim | H05K 5/0221 |
| 2015/0153780 | A1 | 6/2015 | Maatta et al. | |
| 2015/0366089 | A1 | 12/2015 | Park et al. | |
| 2016/0070306 | A1 | 3/2016 | Shin et al. | |
| 2017/0060188 | A1 | 3/2017 | Han et al. | |
| 2021/0018961 | A1* | 1/2021 | Han | G06F 1/1681 |
| 2022/0210937 | A1* | 6/2022 | Yun | H05K 5/0226 |

FOREIGN PATENT DOCUMENTS

| CN | 103562815 A | 2/2014 |
| CN | 104541224 A | 4/2015 |
| CN | 205158204 U | 4/2016 |
| CN | 109313464 A | 2/2019 |
| TW | 202142088 A | 11/2021 |

OTHER PUBLICATIONS

The office action of corresponding TW application No. 111148145 issued on Jul. 6, 2023.

* cited by examiner

*Primary Examiner* — Pete T Lee
(74) *Attorney, Agent, or Firm* — CKC & Partners Co., LLC

(57) ABSTRACT

A supporting assembly comprises a first body having a first surface, a second body having a second surface, a third body having a third surface, a fourth body having a fourth surface, a first hinge member, and a second hinge member. The first hinge member is hinged to the first body and the second body. The second hinge member is hinged to the second body and the third body. The fourth body has hinged to and between the second body and the third body.

21 Claims, 23 Drawing Sheets

FOLDABLE DISPLAY DEVICE AND SUPPORTING ASSEMBLY THEREOF

CROSS-REFERENCE TO RELATED APPLICATION

This application claims priority to U.S. Provisional Application Ser. No. 63/302,545, filed Jan. 24, 2022, and Taiwan Application Ser. No. 111148145, filed Dec. 15, 2022, which also claims priority to the previous U.S. Provisional Application Ser. No. 63/302,545, filed Jan. 24, 2022, all of which are herein incorporated by reference in its entirety.

BACKGROUND

Technical Field

The present invention relates to a display device. More particularly, the present invention relates to a foldable display device and a supporting assembly thereof.

Description of Related Art

Nowadays, some conventional tablets and smartphones which have large display devices can provide large-screen experiences to users. However, it is not convenient to carry the above conventional tablet and the smartphone around by virtue of the large display device, which is often incapable of bending. Hence, the above conventional tablet or smartphone needs a convenient portable design.

SUMMARY

According to some preferred embodiments of the present invention, a foldable display device includes a supporting assembly and a flexible display panel. The supporting assembly includes a first body having a first surface, a second body having a second surface, a first hinge member hinged to both the first body and the second body, a third body having a third surface, a fourth body having a fourth surface and a second hinge member hinged to both the second body and the third body. The fourth body is hinged to and between the second body and the third body. The flexible display panel is disposed to the first surface, the second surface, and the third surface. The first surface, the second surface, the third surface, and the fourth surface are noncoplanar, and the flexible display panel is folded when the foldable display device is folded to be in a first state. A first included angle is formed between two parts of the flexible display panel respectively on the third body and the second body form, while a second included angle is formed between a horizontal line and a part of the flexible display panel on any one of the first body and the second body. The first surface, the second surface, the third surface, and the fourth surface are coplanar, and the flexible display panel is flattened when the foldable display device is flattened to be in a second state.

According to some preferred embodiments of the present invention, a supporting assembly includes a first body having a first surface, a second body having a second surface, a first hinge member hinged to both the first body and the second body, a third body having a third surface, a fourth body having a fourth surface, and the second hinge member hinged to the second body and the third body. The fourth body has hinged to and between the second body and the third body. The first surface, the second surface, and the third surface, and the fourth surface are noncoplanar when the supporting assembly is folded to be in a first state. The first surface, the second surface, and the third surface, and the fourth surface are coplanar when the supporting assembly is flattened to be in a second state.

Based on the above, the first hinge member is hinged to both the first body and the second body, and the second hinge member is hinged to the second body, the third body, and the fourth body, so that the first body, the second body, the third body, and the fourth body can pivot relative to each other via the first hinge member and the second hinge member, thereby folding the foldable display device. Therefore, it is convenient to carry the foldable display device according to at least one preferred embodiment of the invention around, and the above supporting assembly can provide a convenient portable design for mobile apparatus.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DETAILED DESCRIPTION

Figure 1A:
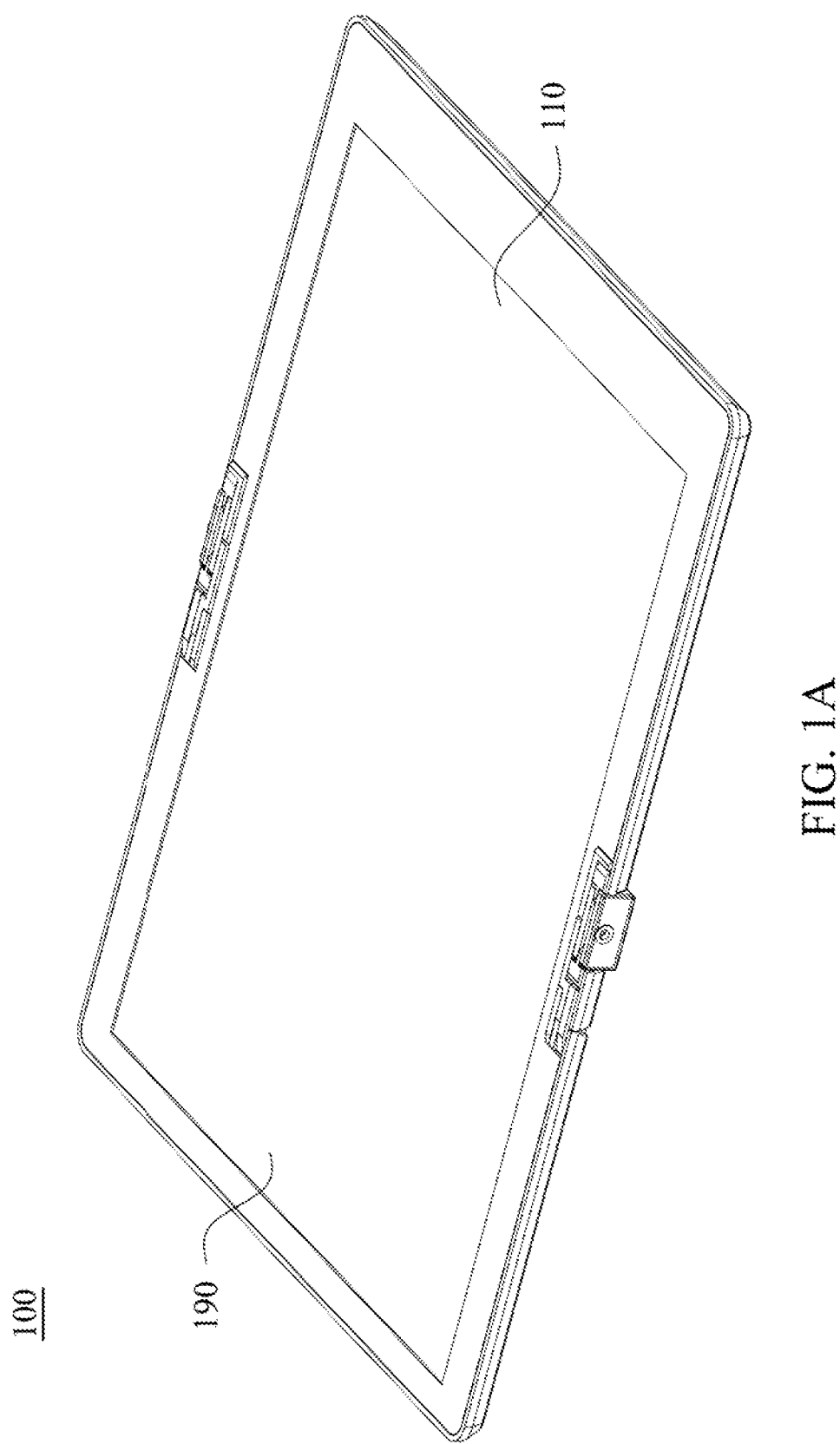
FIG. 1A is schematic perspective view of a foldable display device according to at least one preferred embodiment of the invention.

In the following specification, in order to clearly present the technical features of the present invention, the dimensions (such as length, width, thickness, and depth) of the elements (such as layer, film, substrate, and region, etc.) in the drawings are enlarged in unequal proportions. Hence, the preferred embodiments described herein should not be construed as being limited to the particular dimensions and shapes of elements as illustrated herein but are to include deviations in dimensions, shapes, and both that result, for example, from practical processes and/or tolerances. For instance, regions shown or described as being flat may typically have rough and/or non-linear features. Besides, the acute angle as shown may be round. Therefore, the elements shown in the drawings are schematic in nature, and their shapes are not intended to show the exact shape of the elements, and are not intended to limit the scope of the claims.

The terms used herein such as "about", "approximate", or "substantial" include an explicitly stated value and value range, and include an acceptable deviation range of specific values determined by those with ordinary skills in the art with consideration of discussed measurement, errors, and tolerance related to the measurement. These errors and tolerance are, for example, caused by the limitations of both the measurement system and the process conditions. For instance, two objects (such as the plane or trace of the substrate) are "substantially parallel" or "substantially perpendicular", where "substantially parallel" and "substantially perpendicular" respectively represent the parallelism and perpendicularity between the two objects can include non-parallelism and non-perpendicularity caused by the acceptable deviation range.

In addition, "about" may mean within one or more standard deviations, or within, for example, ±30%, ±20%, ±15%, ±10%, ±5% of the stated value. Moreover, a relatively acceptable range of deviation or standard deviation may be chosen for the term "about", "approximately", or "substantially" as used herein based on optical properties, etching properties, mechanical properties or other properties, instead of applying one standard deviation across all the properties.

FIG. 1A is schematic view of a foldable display device 100 according to at least one preferred embodiment of the invention. Referring to FIG. 1A, a foldable display device 100 includes a supporting assembly 110 (detailed in FIGS. 2A to 2C) and a flexible display panel 190, in which the flexible display panel 190 is attached to the supporting assembly 110.

The supporting assembly 110 and the flexible display panel 190 can be flattened and bent, so the supporting assembly 110 and the flexible display panel 190 can be folded. The flexible display panel 190 may be an organic light emitting diode (OLED) display panel or an electrophoretic display panel, for example. In addition, the foldable display device 100 may be a mobile apparatus, such as tablet, smartphone, or electronic paper, namely e-paper.

The folded foldable display device 100 is in a first state (e.g. close state), whereas the flattened foldable display device 100 is in a second state (e.g. open state), as shown in FIG. 1A. In FIG. 1A, the foldable display device 100 in the second state can be in operation. For example, the foldable display device 100 in the second state can display images. Additionally, the foldable display device 100 may include a touch sensing substrate attached to the flexible display panel 190, so that the foldable display device 100 in the second state can have a touch-control function.

Figure 1B:
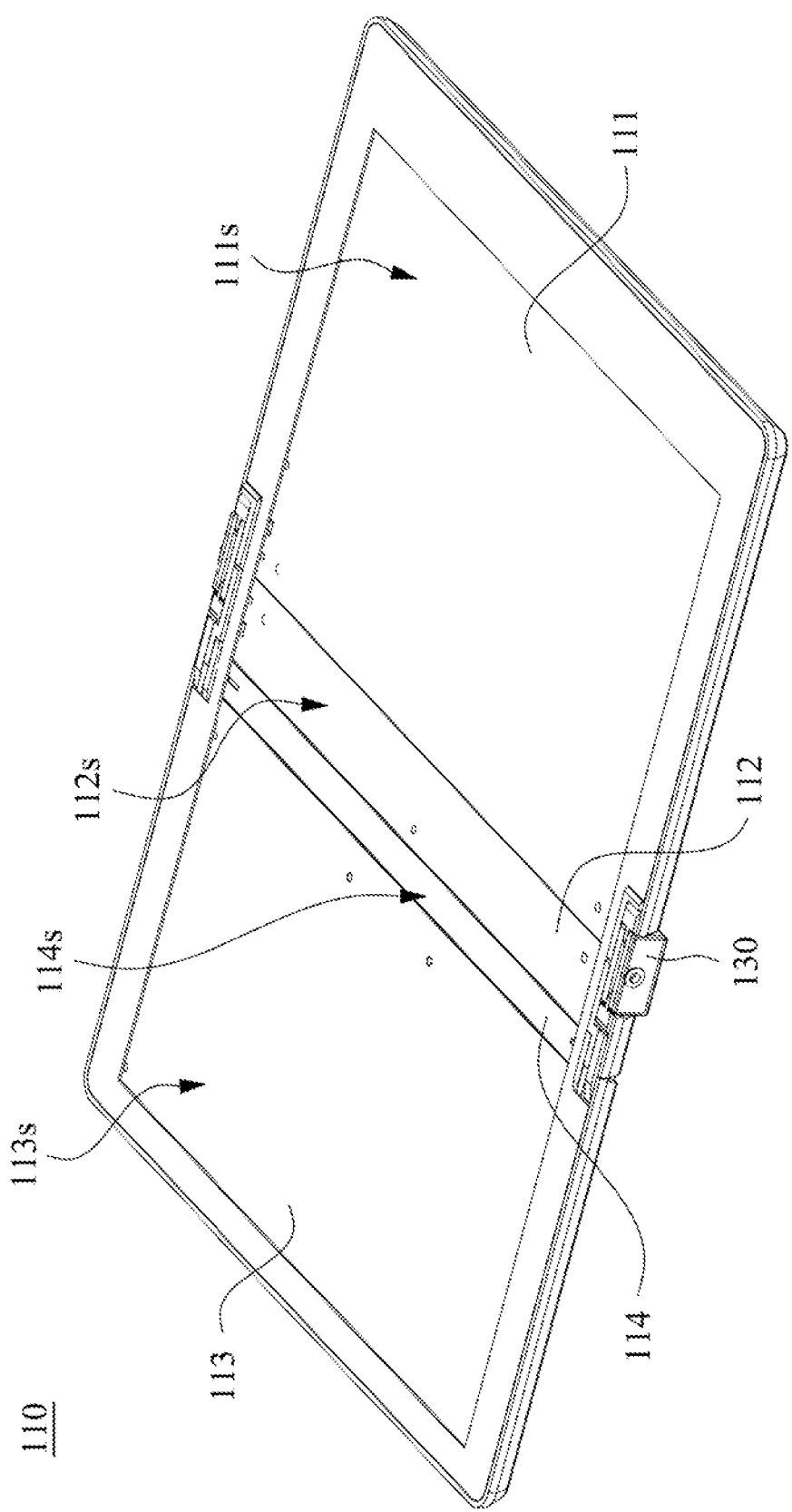
FIG. 1B is a schematic perspective view of the supporting assembly in FIG. 1A by omitting the flexible display panel.

FIG. 1B is a schematic perspective view of the supporting assembly 110 in FIG. 1A by omitting the flexible display panel 190. Referring to FIGS. 1A and 1B, the supporting assembly 110 includes a first body 111, a second body 112, a third body 113, and a fourth body 114, where the first body 111, the second body 112, the third body 113, and the fourth body 114 are connected together in sequence. The fourth body 114 has hinged to and between the second body 112 and the third body 113. As seen FIG. 1B, the size of each of the second body 112, the third body 113 and the fourth body 114 is smaller than the size of the first body 111, the size of the second body 112 is smaller than the size of the third body 113, and the size of the fourth body 114 is smaller than the size of the second body 112. Thus, the fourth body 114 has the smallest size, whereas the first body 111 has the largest size.

The first body 111 has a first surface 111s. The second body 112 has a second surface 112s. The third body 113 has a third surface 113s. The fourth body 114 has a fourth surface 114s. The flexible display panel 190 is disposed to the first surface 111s, the second surface 112s, the third surface 113s, and the fourth surface 114s. Each of the first surface 111s, the second surface 112s, the third surface 113s, and the fourth surface 114s can be a plane, so that the flexible display panel 190 can be flattened smoothly on the first surface 111s, the second surface 112s, the third surface 113s, and the fourth surface 114s in the second state.

Accordingly, the fourth body 114 is located between the second surface 112s and the third surface 113s, the first surface 111s, the second surface 112s, the third surface 113s, and the fourth surface 114s can be coplanar, and the flexible display panel 190 is flattened when the foldable display device 100 is flattened to be in the second state. It is noted that the first surface 111s, the second surface 112s, the third surface 113s, and the fourth surface 114s can be substantially coplanar when the foldable display device 100 is in the second state, in which the first surface 111s, the second surface 112s, the third surface 113s, and the fourth surface 114s can be allowed to be slightly noncoplanar due to a slight error and allowable tolerance.

Figure 4A:
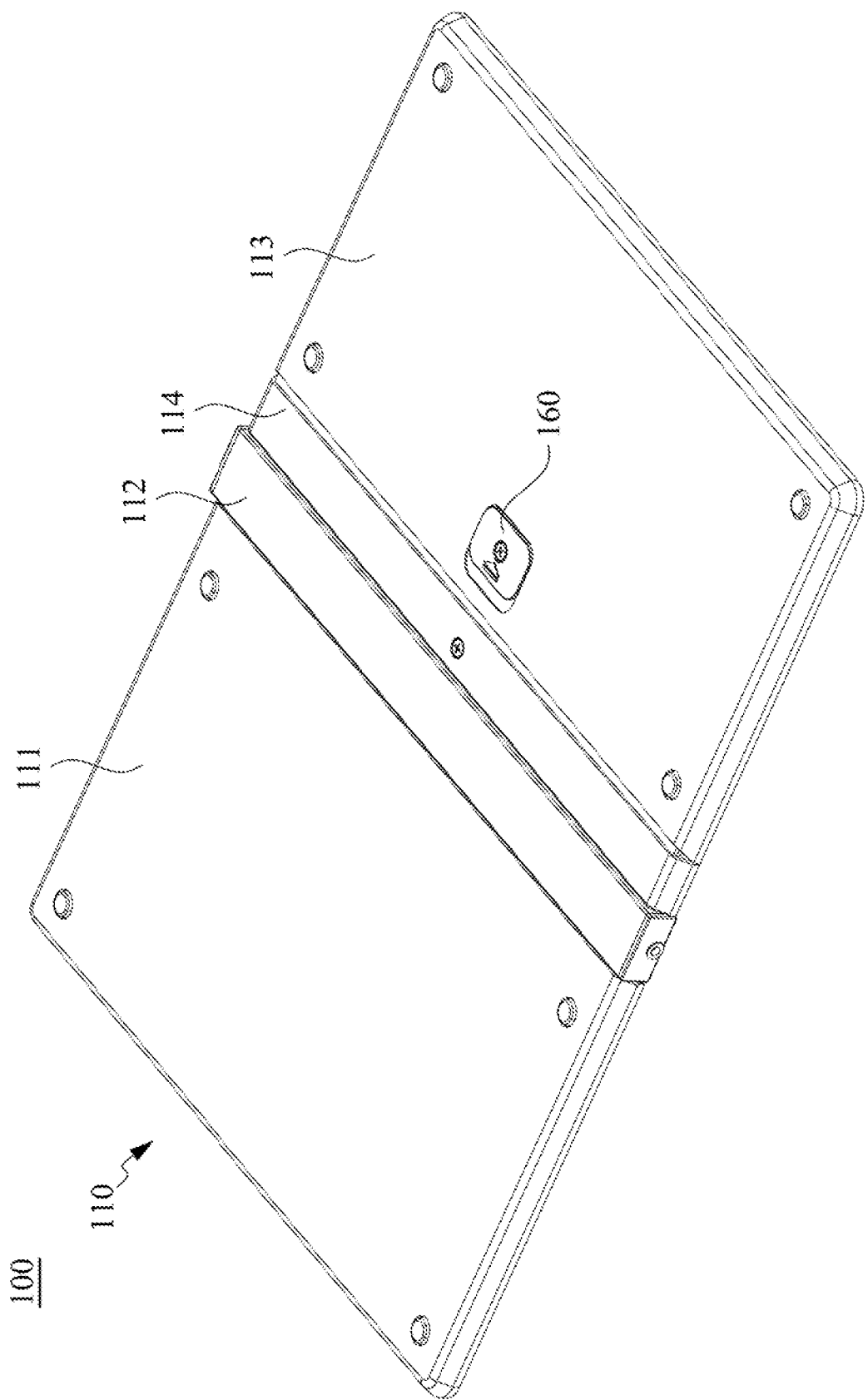
FIG. 4A is a schematic perspective view of the foldable display device in FIG. 1A from another viewing angle.

The first body 111, the second body 112, and the third body 113 can pivot relative to each other when folding or flattening the foldable display device 100. Specifically, the supporting assembly 110 further includes a first hinge member 130, in which the first hinge member 130 is hinged to both the first body 111 and the second body 112, while the second hinge member 140 (shown in FIG. 2A) is hinged to both the second body 112 and the third body 113. In addition, the first hinge member 130 and the second hinge member 140 may include at least one outer case (as shown in FIG. 4A) apiece for protection and aesthetics.

Figure 2A:
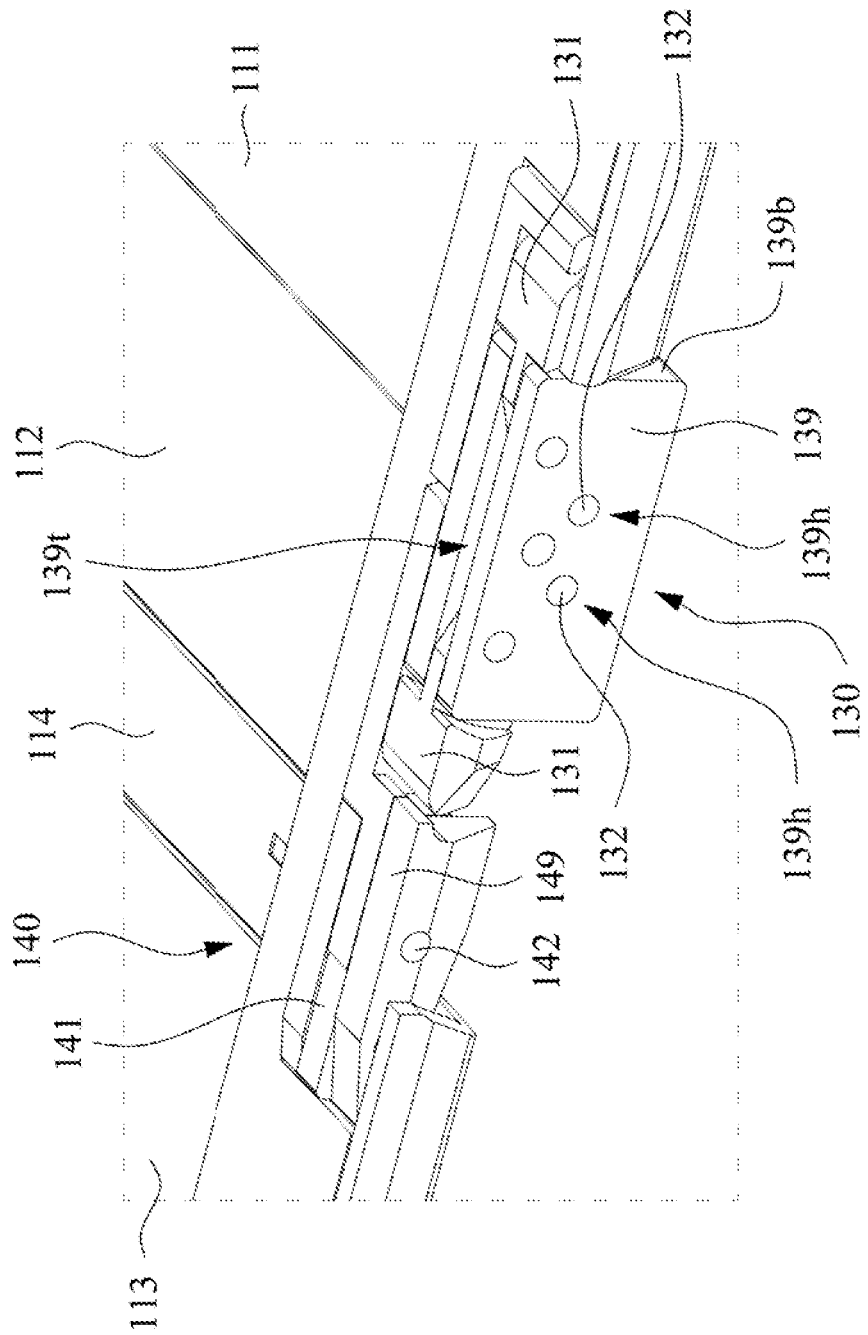
FIGS. 2A, 2B and 2C are schematic partial perspective views of the supporting assembly in FIG. 1B.
Figure 2B:
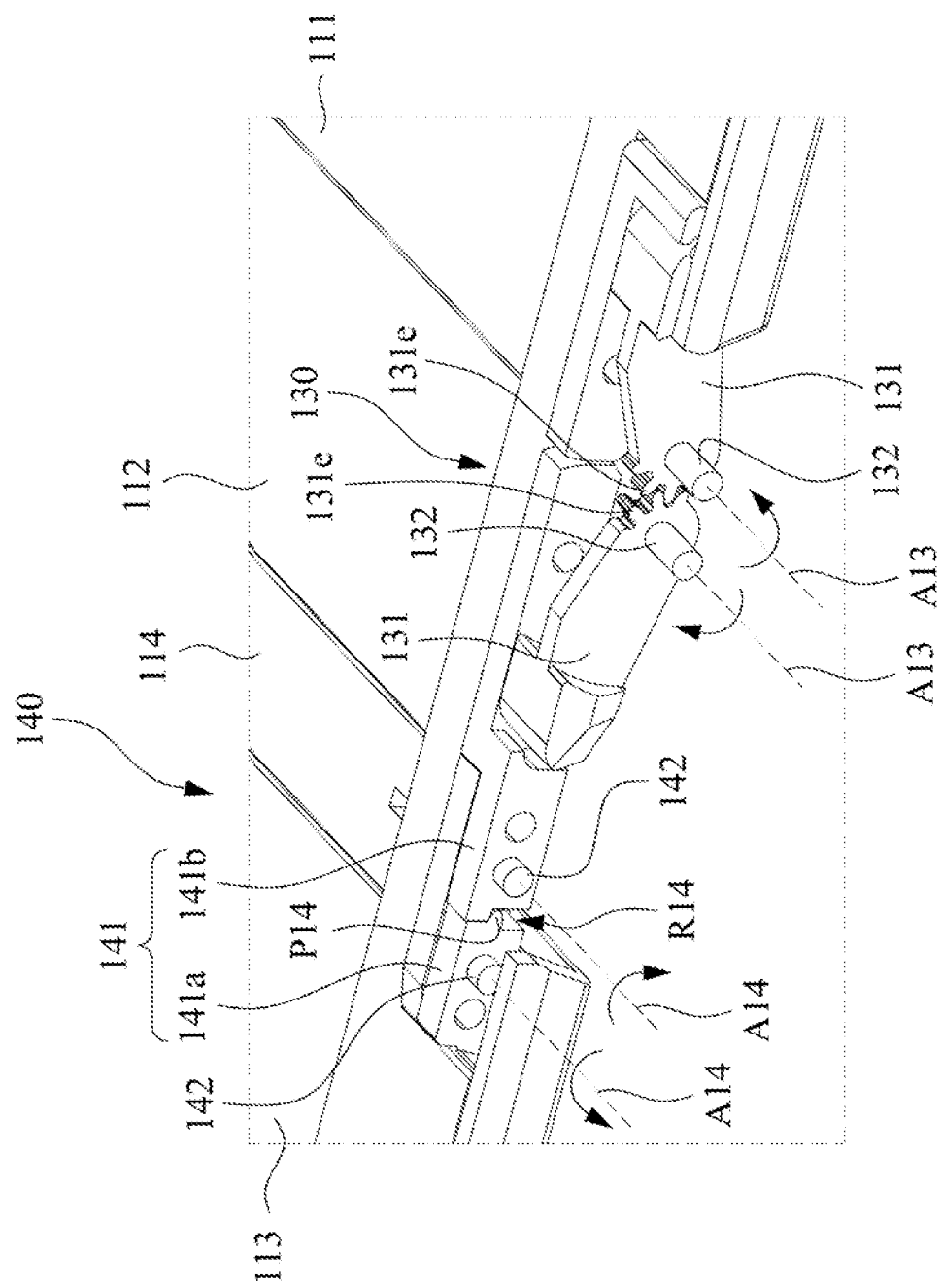

FIGS. 2A and 2B are schematic partial perspective views of the supporting assembly 110 in FIG. 1B, in which both FIGS. 2A and 2B depict the inside of the supporting assembly 110 by omitting the said outer case, and FIG. 2B further omits the restricting parts 139 of the first hinge member 130 and the blocking member 149 of the second hinge member 140, so as to clearly present the detailed structures of the first hinge member 130 and the second hinge member 140. Referring to FIGS. 1B, 2A and 2B, on two opposite sides of the supporting assembly 110, the first hinge member 130 further includes a plurality of hinge parts 131 and two restricting parts 139. In the present embodiment, two hinge parts 131 and the restricting part 139 are disposed on one side of the supporting assembly 110. The restricting parts 139 have a trench 139t apiece, where two hinge parts 131 are connected to each other and disposed in one trench 139t. In addition, in some embodiments, the hinge parts 131 may be cam shafts.

As shown in FIGS. 1B and 2A, both the first body 111 and the second body 112 are disposed between two restricting parts 139. Since both FIGS. 2A and 2B depict the partial inside of the supporting assembly 110 at one first hinge member 130 and one second hinge member 140, FIGS. 2A and 2B show only one restricting part 139 and two hinge parts 131, whereas the other restricting part 139 and hinge parts 131 are not shown in FIGS. 2A and 2B.

The first hinge member 130 further includes a plurality of shafts 132. The shafts 132 pass through the hinge parts 131 respectively and have a first axis A13 apiece. Two hinge parts 131 can pivot relative to each other around two shafts 132, as shown in FIG. 2B. In addition, the shafts 132 also pass through the restricting parts 139 respectively. Specifically, each of the restricting parts 139 has a plurality of holes 139h, and both the holes 139h and the trench 139t communicate in the same restricting part 139. Two shafts 132 pass through two holes 139h and two hinge parts 131 separately, so the hinge parts 131 connected to each other can pivot relative to the restricting part 139.

As a result, each of the hinge parts 131 can pivot around one first axis A13, and the adjacent two hinge parts 131 pivot in different directions. Taking FIG. 2B for example, the right hinge part 131 can pivot counterclockwise, whereas the left hinge part 131 can pivot clockwise. Moreover, each of the hinge parts 131 may have a geared end 131e, so the adjacent two hinge parts 131 can engage by the geared ends 131e and pivot at the same time.

In addition, the restricting parts 139 can restrict the rotation of each hinge part 131. Specifically, when the foldable display device 100 is in the second state, the bottom 139b of the restricting part 139 can block the adjacent two hinge parts 131 pivoting in two different directions separately. Taking FIGS. 2A and 2B for example, the bottom 139b of the restricting part 139 can block the right hinge part 131 pivoting clockwise and block the left hinge part 131 pivoting counterclockwise, so that the restricting part 139 can prevent the flexible display panel 190 from damaging due to overstretching.

The hinge parts 131 can pivot around the first axes A13 when folding or flattening the supporting assembly 110. Since the hinge parts 131 in the same restricting part 139 are connected to the first body 111 and the second body 112 respectively, the first body 111 and the second body 112 should be pivoted around the axes A13 respectively.

Referring to FIGS. 1B, 2A and 2B, on two opposite sides of the supporting assembly 110, the second hinge member 140 further includes a pair of hinge parts 141. The fourth body 114 is located between the second body 112 and the third body 113 when the foldable display device 100 is in the second state, while the fourth body 114 is also located between the pair of hinge parts 141. The fourth body 114 is connected to the first piece 141a and the second piece 141b of the hinge parts 141 by using two shafts 142, in which the first piece 141a and the second piece 141b may be cam shafts. The shafts 142 are disposed in the holes of the first piece 141a and the second piece 141b, or partially disposed inside the first piece 141a and the second piece 141b. The shafts 142 are disposed in the fourth body 114, so as to control the rotation of the fourth body 114 during folding.

Each of the hinge parts 141 located between the fourth body 114 and the blocking member 149 supports two shafts 142 and is connected to the shaft 142 and the blocking member 149. The blocking member 149 is linked to the first piece 141a and the second piece 141b, using two shafts 142. Pivot shafts 142 are put into holes of first piece 141a and second piece 141b, or part of first piece 141a and second piece 141b.

It is noted that since FIGS. 2A and 2B depict the partial inside of the supporting assembly 110 at the first hinge member 130 and the second hinge member 140, FIGS. 2A and 2B show only one hinge part 141. The other hinge part 141 is not shown in FIGS. 2A and 2B. In addition, FIG. 2B depicts the hinge part 141 having the first piece 141a and the second piece 141b.

The pair of hinge parts 141 includes a first piece 141a and a second piece 141b apiece, and the second hinge member 140 may further include a plurality of shafts 142. The shafts 142 pass through the first piece 141a and the second piece 141b respectively and have a second axis A14 apiece. In the present embodiment, the second body 112 and the third body 113 are designed as a dual axis torque hinge.

In some embodiments, the first piece 141a and the third body 113 may be integrally into one, and the second piece 141b and the second body 112 may be integrally into one. Hence, the third body 113 can pivot relative to both the second body 112 and the fourth body 114 around the second axis A14 passing through the first piece 141a via the second hinge member 140 when folding or flattening the foldable display device 100 (or the supporting assembly 110). Likewise, the second body 112 and the third body 113 are only pivoted around the second axis A14.

Figure 2C:
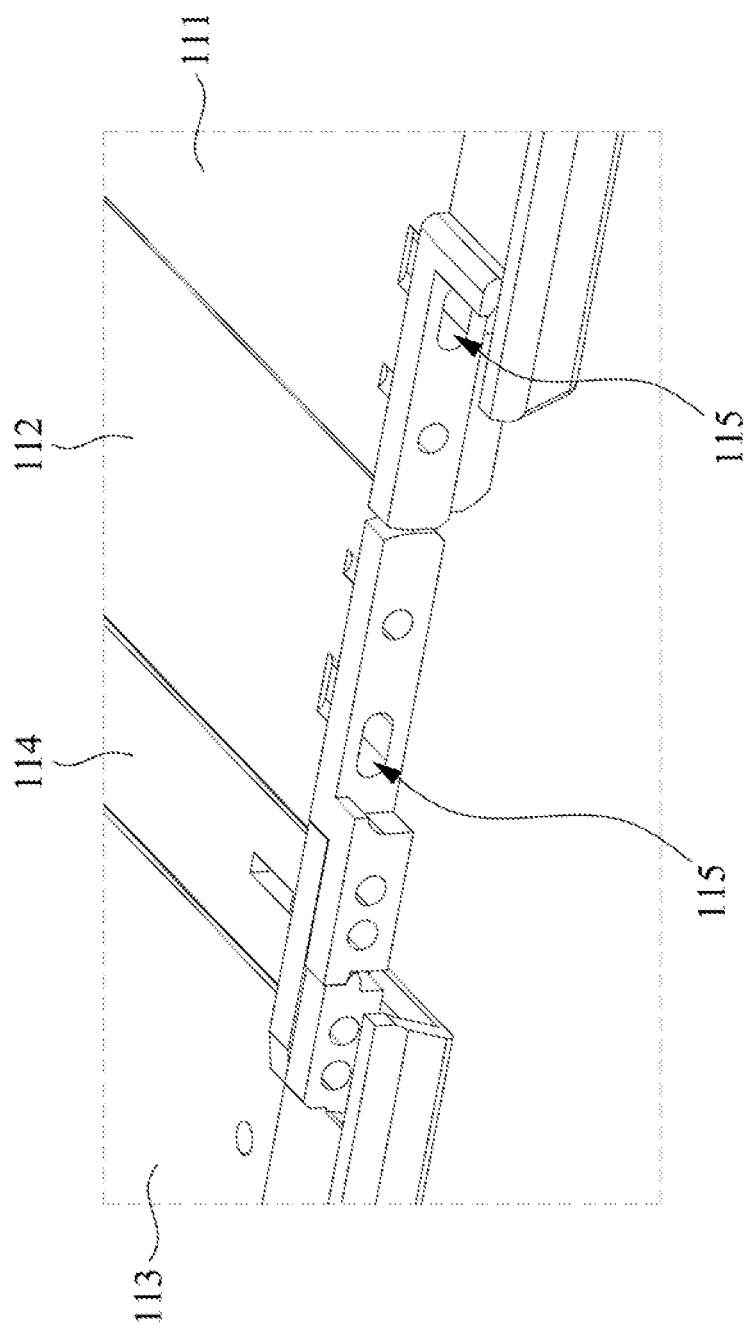

Referring to FIGS. 2B and 2C, FIG. 2C omits the hinge parts 131 and 141 of FIG. 2B. The first body 111 and the second body 112 may further have an elliptical hole 115 apiece, so that the two hinge parts 131 can be inserted in the two elliptical holes 115 respectively. A pivot shaft is put into each elliptical holes 115 of the second body 112, to control height position of the second body 112 during folding.

In some embodiments, each first piece 141a has a protrusion P14, and each second piece 141b has a recess R14. The protrusion P14 will enter the recess R14 when the foldable display device 100 (or the supporting assembly 110) is in the second state. Conversely, the protrusion P14 will leave the recess R14 when the foldable display device 100 (or the supporting assembly 110) is in the first state. In addition, both the first axis A13 and the second axis A14 can extend in one direction. In other words, the first axis A13 can be substantially parallel to the second axis A14 within the allowable tolerance range.

When the protrusion P14 enters the recess R14 in the second state, the rotation of each of the first piece 141a and the second piece 141b will be restricted. Specifically, it is apparent for FIG. 2B that in the second state, the protrusion P14 in the recess R14 abuts on the second piece 141b, that is, the first piece 141a and the second piece 141b abut on each other, so that in FIG. 2B, the first piece 141a cannot pivot clockwise, whereas the second piece 141b cannot pivot counterclockwise, thereby restricting the rotation of each of the first piece 141a and the second piece 141b.

Figure 3A:
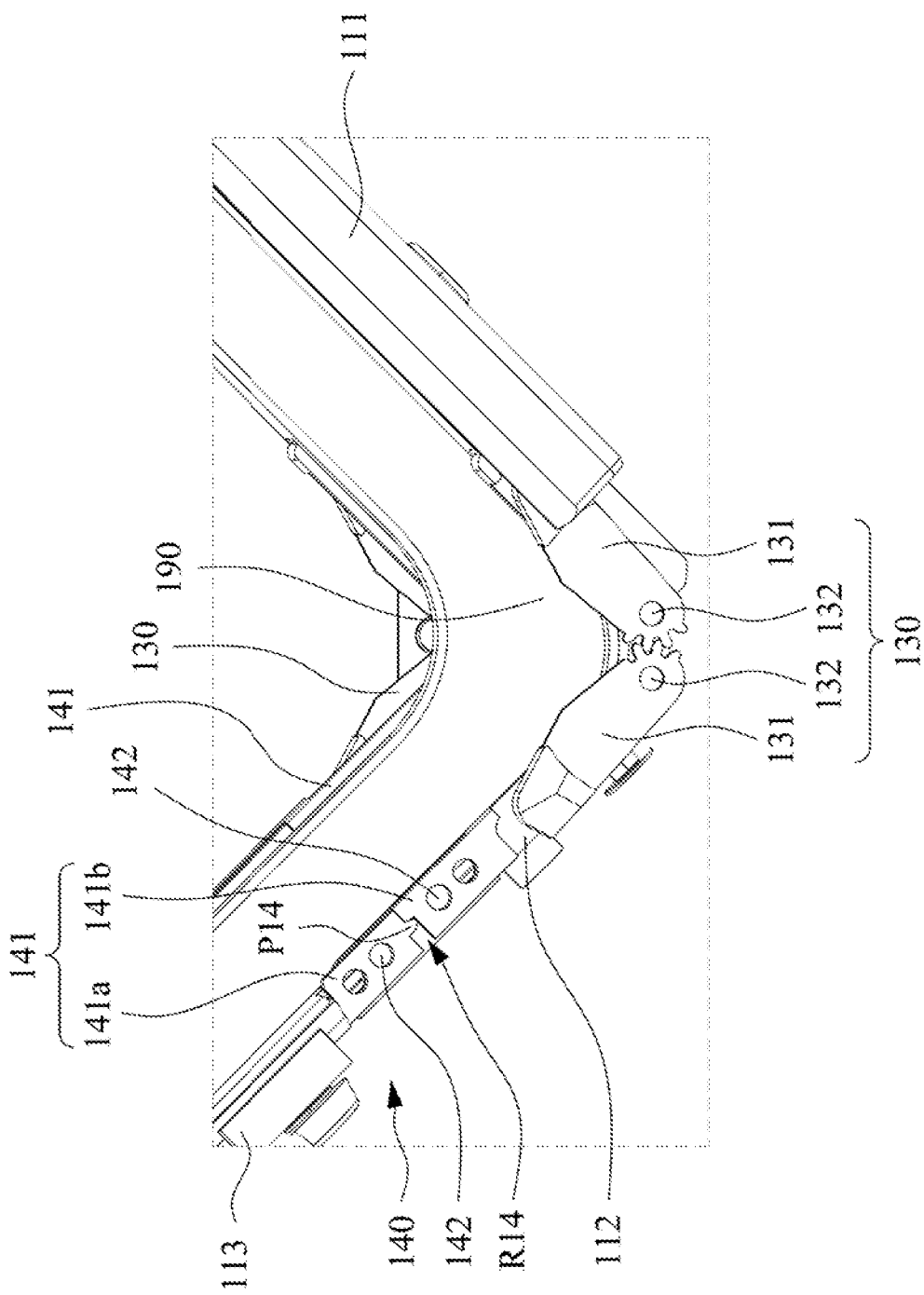
FIG. 3A is a schematic perspective view of folding the foldable display device in FIG. 1A.

FIG. 3A is a schematic perspective view of folding the foldable display device 100 in FIG. 1A, in which FIG. 3A omits some components, such as the restricting part 139 and the blocking member 149. Referring to FIG. 3A, the second body 112 can pivot around the shafts 132 by the first hinge member 130 when the flat foldable display device 100 is folding. In addition, as seen in FIG. 3A, a side of the first piece 141a can be flush with a side of the second piece 141b when the protrusion P14 is in the recess R14.

Figure 3B:
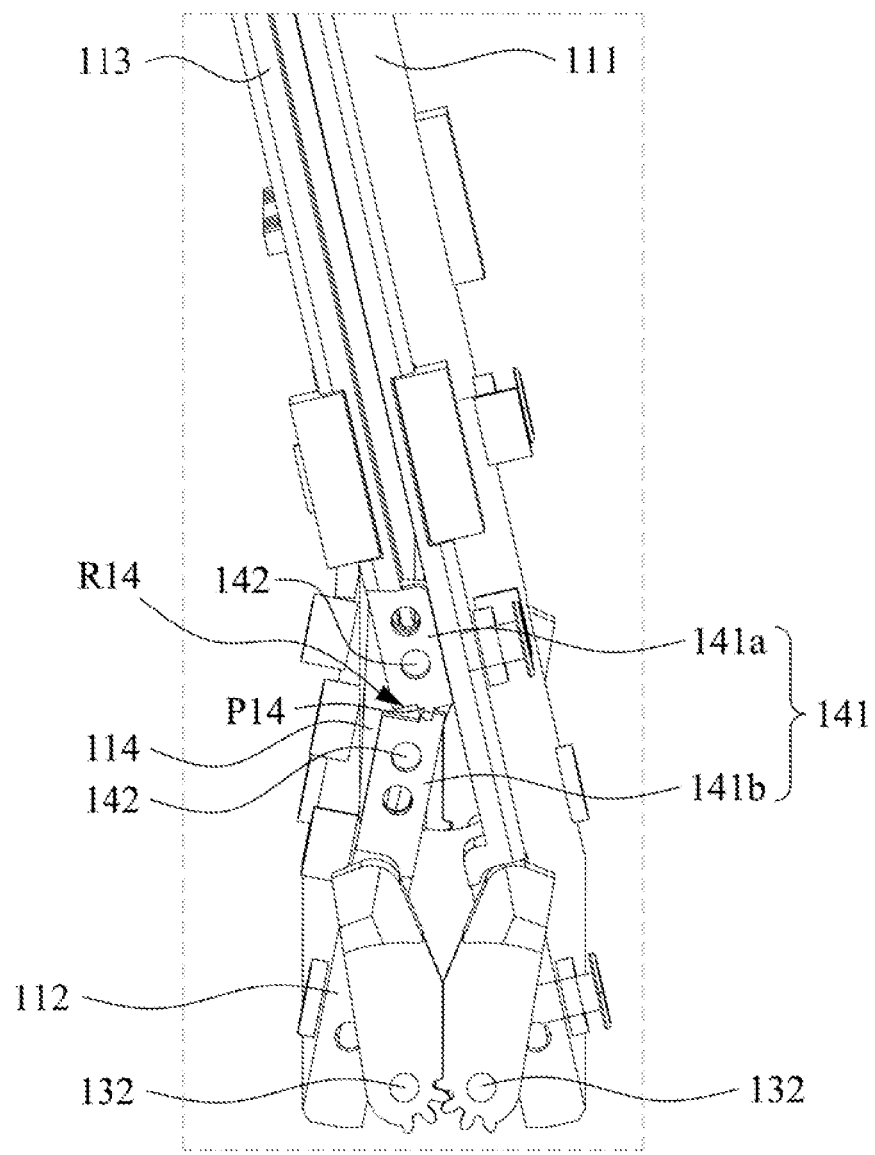
FIG. 3B is a schematic side elevation view of the folded supporting assembly in FIG. 2B in the first state.

FIG. 3B is a schematic side elevation view of the folded supporting assembly 110 in FIG. 2B in the first state, in which FIG. 3B mainly depicts the inside of the supporting assembly 110 in the first state. Referring to FIG. 3B, it is apparent from FIG. 3B that the protrusion P14 leaves the recess R14 in the first state. Moreover, the folded supporting assembly 110 in FIG. 3B has a P-shaped side, in which the first body 111 and the third body 113 are disposed opposite to each other, and the first body 111 is adjacent to the third body 113.

Figure 3C:
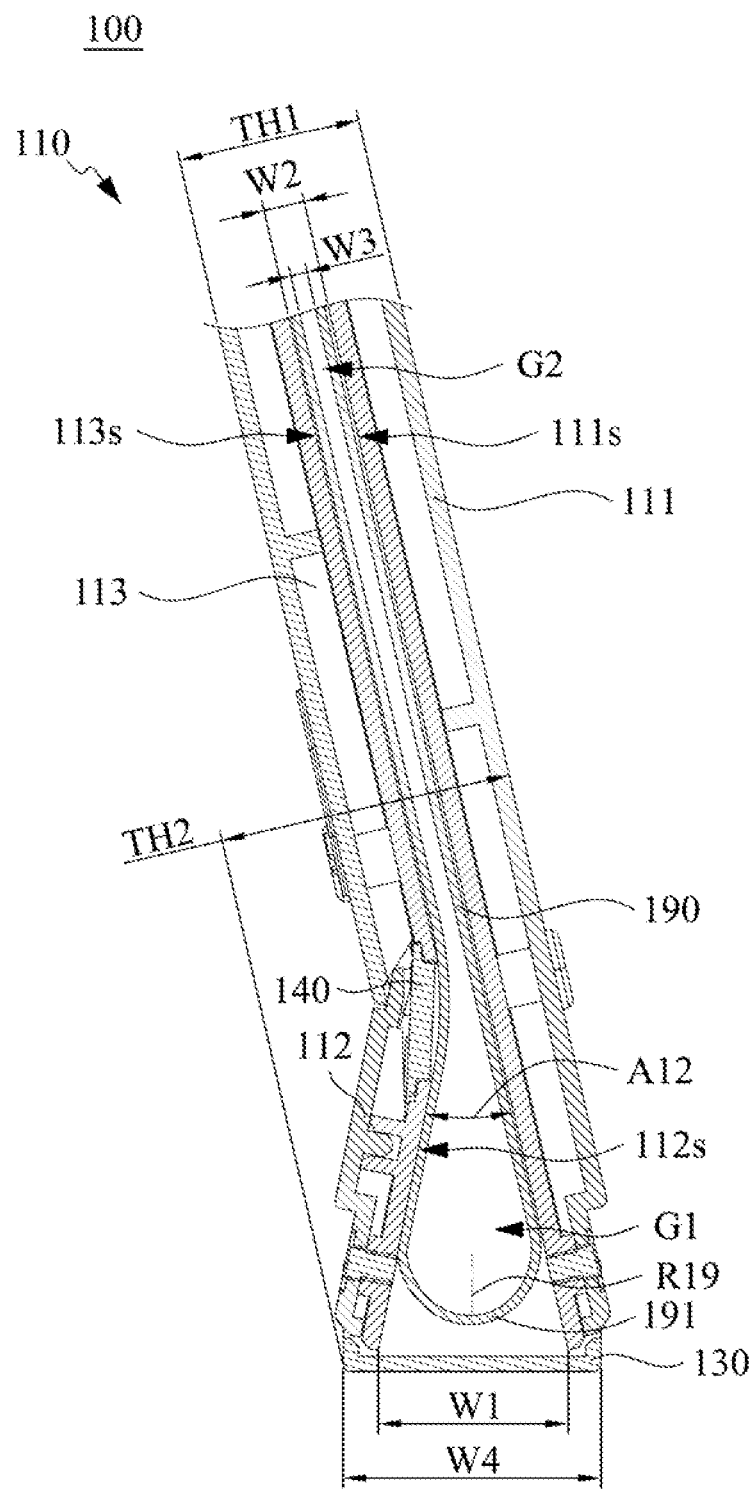
FIG. 3C is a schematic cross-sectional view of the foldable display device in the first state.

FIG. 3C is a schematic cross-sectional view of the foldable display device 100 in the first state, in which the flexible display panel 190 is attached to the first surface 111s, the second surface 112s, and the third surface 113s by adhesive (not shown in FIG. 3C). Referring to FIG. 3C, the first surface 111s, the second surface 112s, the third surface 113s, and the fourth surface 114s are noncoplanar, and the flexible display panel 190 is folded when the folded foldable display device 100 (or the folded supporting assembly 110) is in the first state. Hence, both the foldable display device 100 and the supporting assembly 110 can be switched between the second state (as shown in FIGS. 1A and 1B) and the first state by the second hinge member 140.

In the first state, a first gap G1 is formed between the first surface 111s and the second surface 112s, and a second gap G2 is formed between the first surface 111s and the third surface 113s. As seen in FIG. 3C, the width of the first gap G1 is obviously greater than the width of the second gap G2. The width of the first gap G1 gradually decreases from the first hinge member 130 to the second hinge member 140. Since the first body 111 and the third body 113 are disposed opposite to each other, the first body 111 and the third body 113 can be stacked basically, and the foldable display device 100 or the supporting assembly 110 in the first state has a first thickness TH1 and a second thickness TH2, in which the first thickness TH1 is obviously thinner than the second thickness TH2.

As seen in FIG. 3C, the first thickness TH1 extends from the first body 111 to the third body 113, while the second thickness TH2 extends from the first body 111 to the second body 112, where the second thickness TH2 can also gradually decrease from the edge of the second body 112 which is adjacent to the first hinge member 130 to the third body 113. Therefore, the side of the folded foldable display device 100 (or the folded supporting assembly 110) can take the shape of "P", as shown in FIG. 3C.

In the first state, each of the foldable display device 100 and the supporting assembly 110 has an acute included angle A12 formed between the first surface 111s and the second surface 112s, where the acute included angle A12 is opposite to the first hinge member 130. Hence, the width W4 of the first hinge member 130 can tilt relative to both the second body 112 and the first body 111. In other words, the width W4 is not perpendicular to both the first surface 111s and the second surface 112s, so the tilted width W4 can facilitate the decrease of the whole thickness of the foldable display device 100, thereby satisfying the convenient portable design for mobile apparatus.

In this preferred embodiment, the flexible display panel 190 in the first state can have a gap width W3 that can range between 1 mm and 4 mm (such as 1.76 mm), in which the gap width W3 is located between the first surface 111s and the third surface 113s. Since the width W1 of the first gap G1 is greater than the width W2 of the second gap G2, the folded flexible display panel 190 in the first state can further have a curved-folding part 191 surrounded by the first hinge member 130, the first body 111, and the second body 112.

The curved-folding part 191 of the flexible display panel 190 has a radius R19 of curvature, where the radius R19 is greater than the gap width W3, and the radius R19 can range between 1 mm and 7.5 mm, such as about 4 mm (such as 4.33 mm). Hence, the supporting assembly 110 cannot fold the flexible display panel 190 flat, so as to avoid damaging the flexible display panel 190.

Figure 3D:
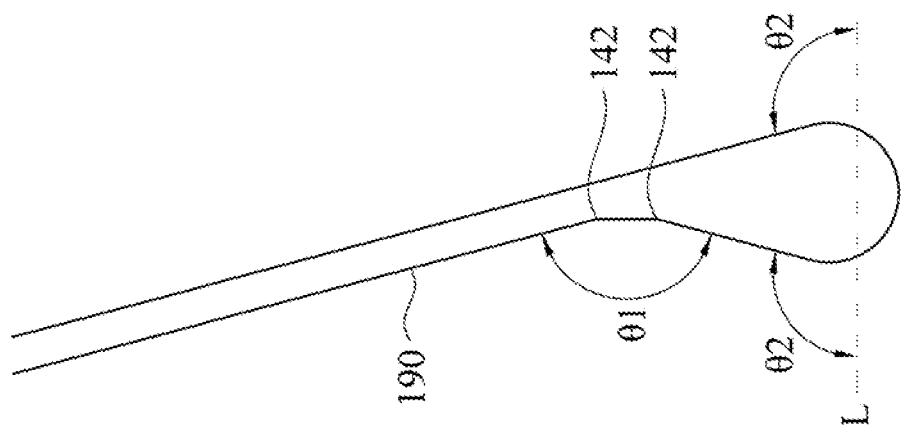
FIG. 3D is a schematic view of the flexible display panel in the first state.

FIG. 3D is a schematic view of the flexible display panel 190 in the first state, which is equivalent to the flexible display panel 190 of FIG. 3C without the supporting assembly 110, for example. Meanwhile, referring to FIGS. 3C and 3D, when the foldable display device 100 of FIG. 3C is in the first state, a first included angle θ1 formed between two parts of the flexible display panel 190 respectively on the third body 113 and the second body 112 ranges between 145 and 165 degrees (such as 154 degrees), and a second included angle θ2 formed between a horizontal line L and a part of the flexible display panel 190 on any one of the first body 111 and the second body 112 ranges between 95 and 115 degrees (such as 103 degrees).

Figure 4B:
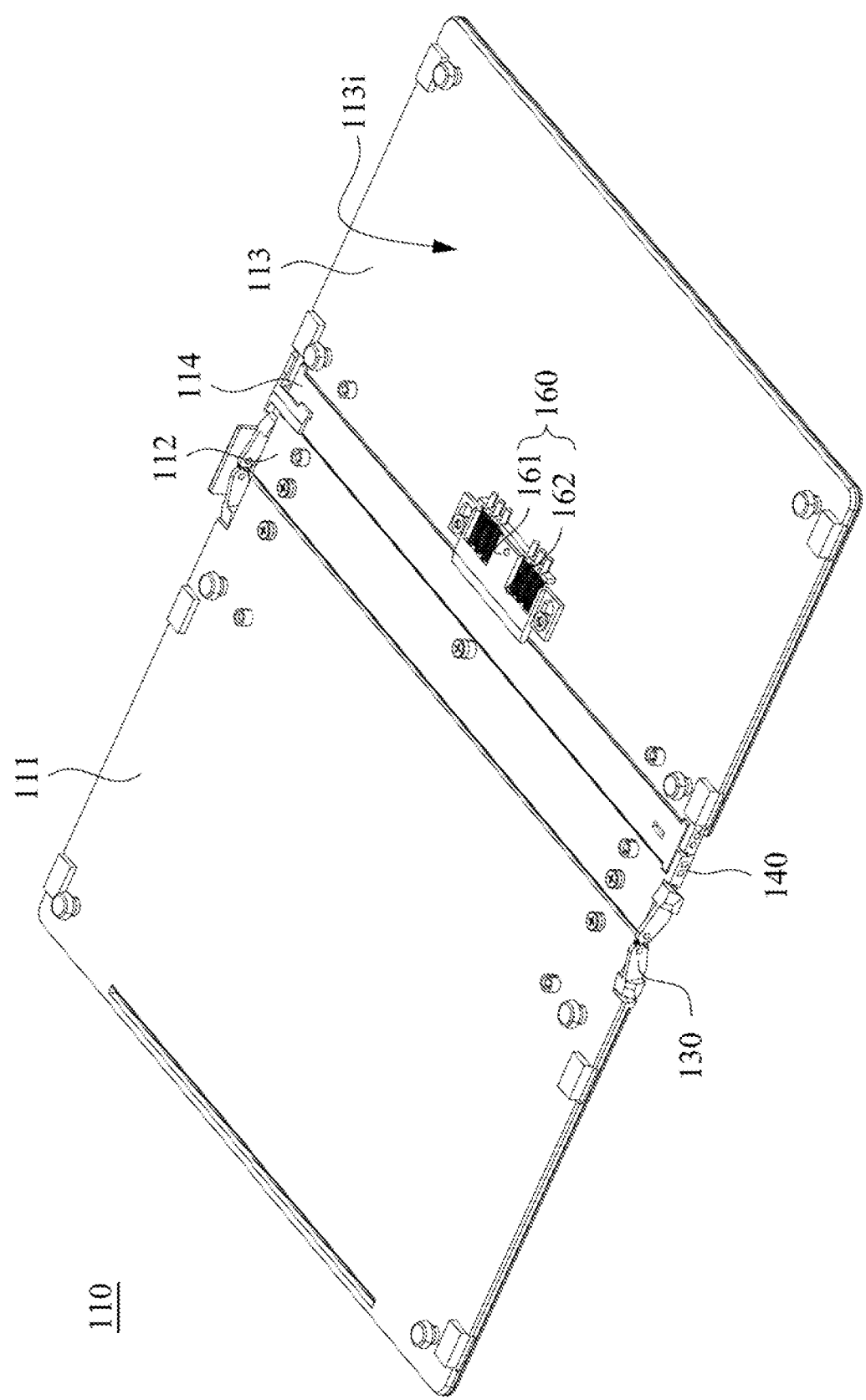
FIG. 4B is a schematic perspective view of the supporting assembly in FIG. 4A by omitting some outer cases.

FIG. 4A is a schematic perspective view of the foldable display device 100 in FIG. 1A from another viewing angle (from backside), and FIG. 4B is a schematic perspective view of the supporting assembly 110 in FIG. 4A by omitting some outer cases. The outer cases are depicted in FIG. 4A and not labeled. Referring to FIGS. 4A and 4B, the supporting assembly 110 may further include a blocking member 160 disposed in the third body 113 and adjacent to the fourth body 114.

Figure 4C:
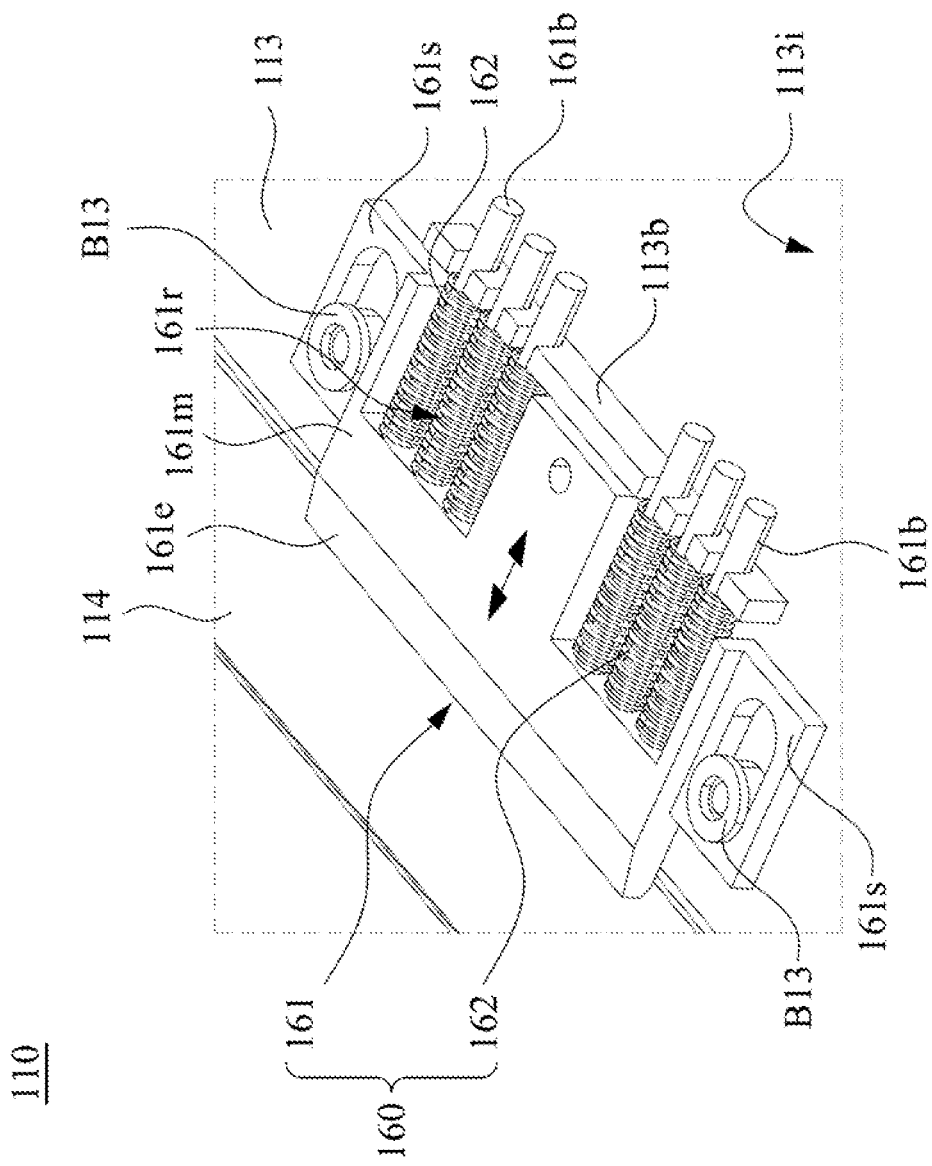
FIG. 4C is a schematic partial perspective view of the supporting assembly in FIG. 4B.

FIG. 4C is a schematic partial perspective view of the supporting assembly in FIG. 4B. Referring to FIGS. 4B and 4C, the blocking member 160 includes a sliding part 161 and at least one restoration component 162. The sliding part 161 is movably disposed to the third body 113, so that the sliding part 161 can be moved from the third body 113 to the fourth body 114, and back to the third body 113, in which the fourth body 114 can be located between the flexible display panel 190 and the sliding part 161. Moreover, the sliding part 161 can slide along the inner surface 113i of the third body 113.

In the preferred embodiment shown in FIG. 4C, the blocking member 160 can include a plurality of restoration components 162, in which each of the restoration components 162 is connected to the sliding part 161, and the restoration components 162 are arranged side by side. However, in other preferred embodiment, the quantity of the restoration component 162 within the blocking member 160 can be only one, so that the quantity of the restoration component 162 included by the blocking member 160 is not limited to two or more than two.

The restoration components 162 may be springs, such as coil springs or torsion springs. In this preferred embodiment, each of the restoration components 162 is a coil spring, so the restoration component 162 can extend and contract. Accordingly, the restoration components 162 can cause the sliding part 161 to move to the fourth body 114, so that the sliding part 161 can extend from the third body 113 to the fourth body 114 when the flattened foldable display device 100 is in the second state.

When the sliding part 161 extends to the fourth body 114, the sliding part 161 can touch the fourth body 114, so that the sliding part 161 can block the relative rotation between the fourth body 114 and the third body 113. Hence, the sliding part 161 can stop the relative rotation between the second body 112 and the third body 113, so as to remove the backlash of the second body 112 and the third body 113 and prevent a sudden fold of the foldable display device 100, thereby facilitating the smooth use of the foldable display device 100 when watching or reading the foldable display device 100.

Taking FIG. 4C for example, the sliding part 161 can include a main portion 161m, a plurality of bars 161b, and two extension sections 161s. The main portion 161m is movably disposed to the third body 113 and connected between the extension sections 161s. The main portion 161m may have a tapered end 161e. The tapered end 161e can touch the fourth body 114 when the sliding part 161 extends to the fourth body 114. The main portion 161m may further have two recesses 161r, and the bars 161b are connected to the main portion 161m and located in the recesses 161r. Each of the bars 161b is inserted into one restoration component 162, where all of the bars 161b extend in the same direction and are arranged side by side.

In addition, the third body 113 has a stopping bump 113b, where the stopping bump 113b can limit and stop the movement of the sliding part 161. The stopping bump 113b has a plurality of grooves (not labeled). The bars 161b can pass through the grooves respectively and move relative to the stopping bump 113b. The restoration components 162 are restricted within the recesses 161r. The extension sections 161s have an opening apiece, and the third body 113 further has two restricting bumps B13 which may be screws, for example. The restricting bumps B13 are located in the openings respectively, so that the restricting bumps B13 can limit the movement of the sliding part 161.

Figure 5A:
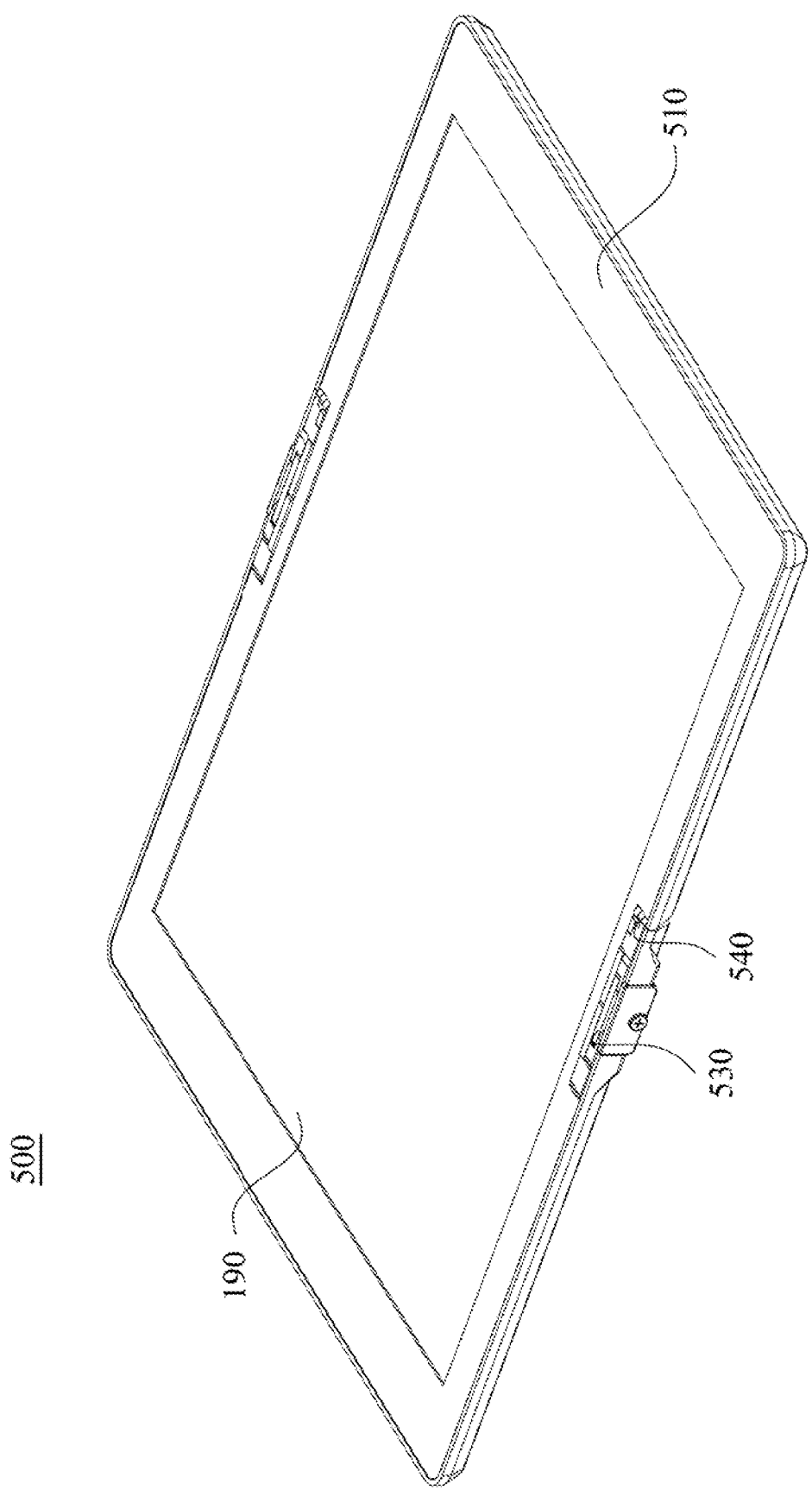
FIG. 5A is a schematic perspective view of a foldable display device according to another preferred embodiment of the invention.
Figure 5B:
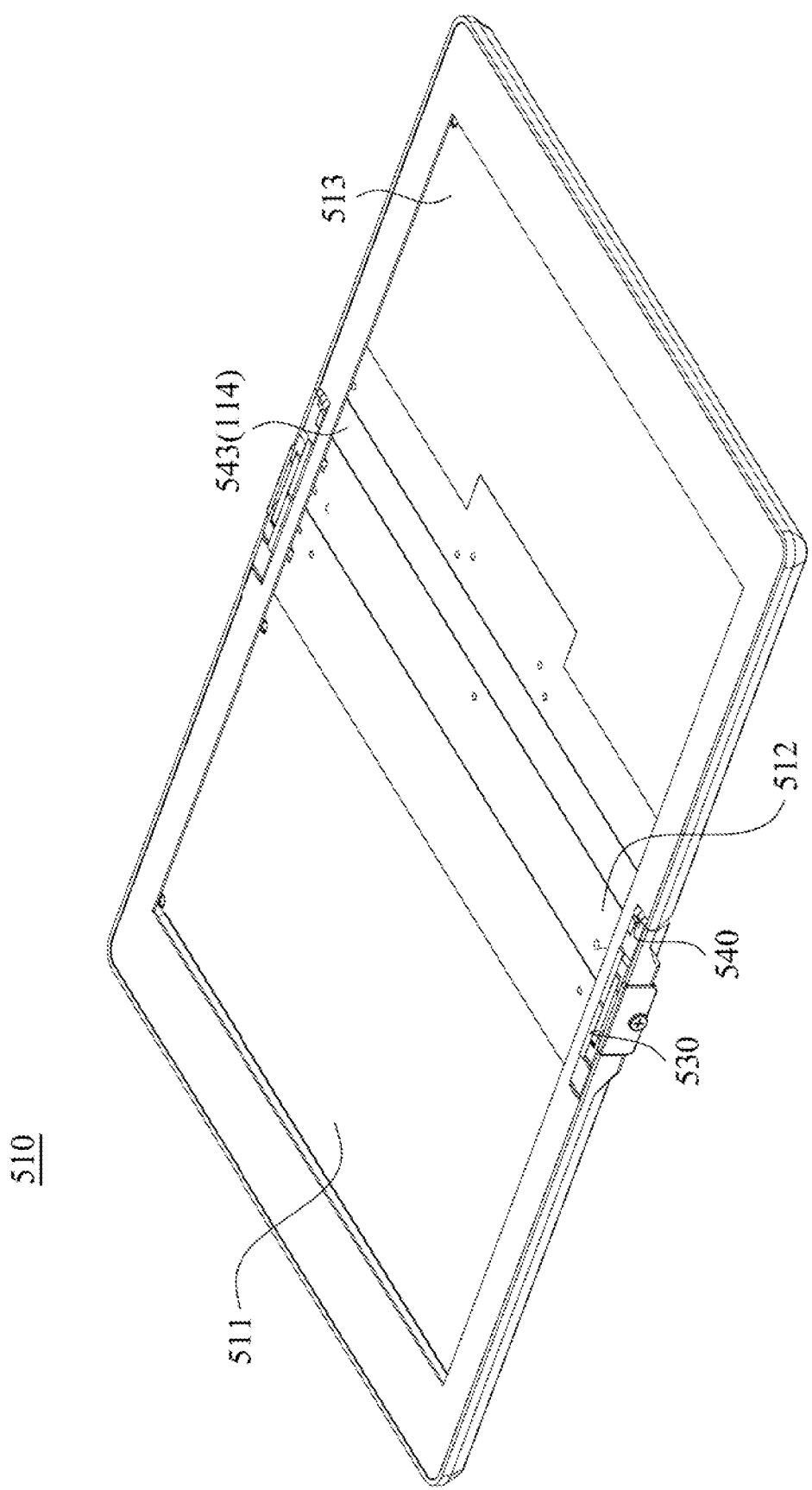
FIG. 5B is schematic perspective view of the supporting assembly in FIG. 5A by omitting the flexible display panel.

FIG. 5A is a schematic perspective view of a foldable display device 500 according to another preferred embodiment of the invention, and FIG. 5B is schematic perspective views of the supporting assembly 510 in FIG. 5A by omitting the flexible display panel 190. Referring to FIGS. 5A and 5B, the foldable display device 500 of this preferred embodiment is similar to the previous foldable display device 100. For example, the foldable display device 500 includes a supporting assembly 510 and a flexible display panel 190, in which the flexible display panel 190 is attached to the supporting assembly 510.

The foldable display device 500 can be folded and flattened. The folded foldable display device 500 is in a first state, whereas the flattened foldable display device 500 is in a second state. In FIGS. 5A and 5B, the foldable display device 500 and the supporting assembly 510 are in the second state. The foldable display device 500 may include a touch sensing substrate attached to the flexible display panel 190, so that the foldable display device 500 in the second state can further have a touch-control function.

The supporting assembly 510 includes a first body 511, a second body 512, a third body 513, a fourth body 114, a first hinge member 530, and a second hinge member 540. In the present embodiment, the fourth body 114 may be a support plate 543. The first body 511, the second body 512, and the third body 513 can pivot relative to each other via the first hinge member 530 and the second hinge member 540 when folding or flattening the foldable display device 500. In addition, the structures of the first body 511, the second body 512, and the first hinge member 530 are substantially the same as the structures of the first body 111, the second body 112, and the first hinge member 130 respectively.

Figure 6A:
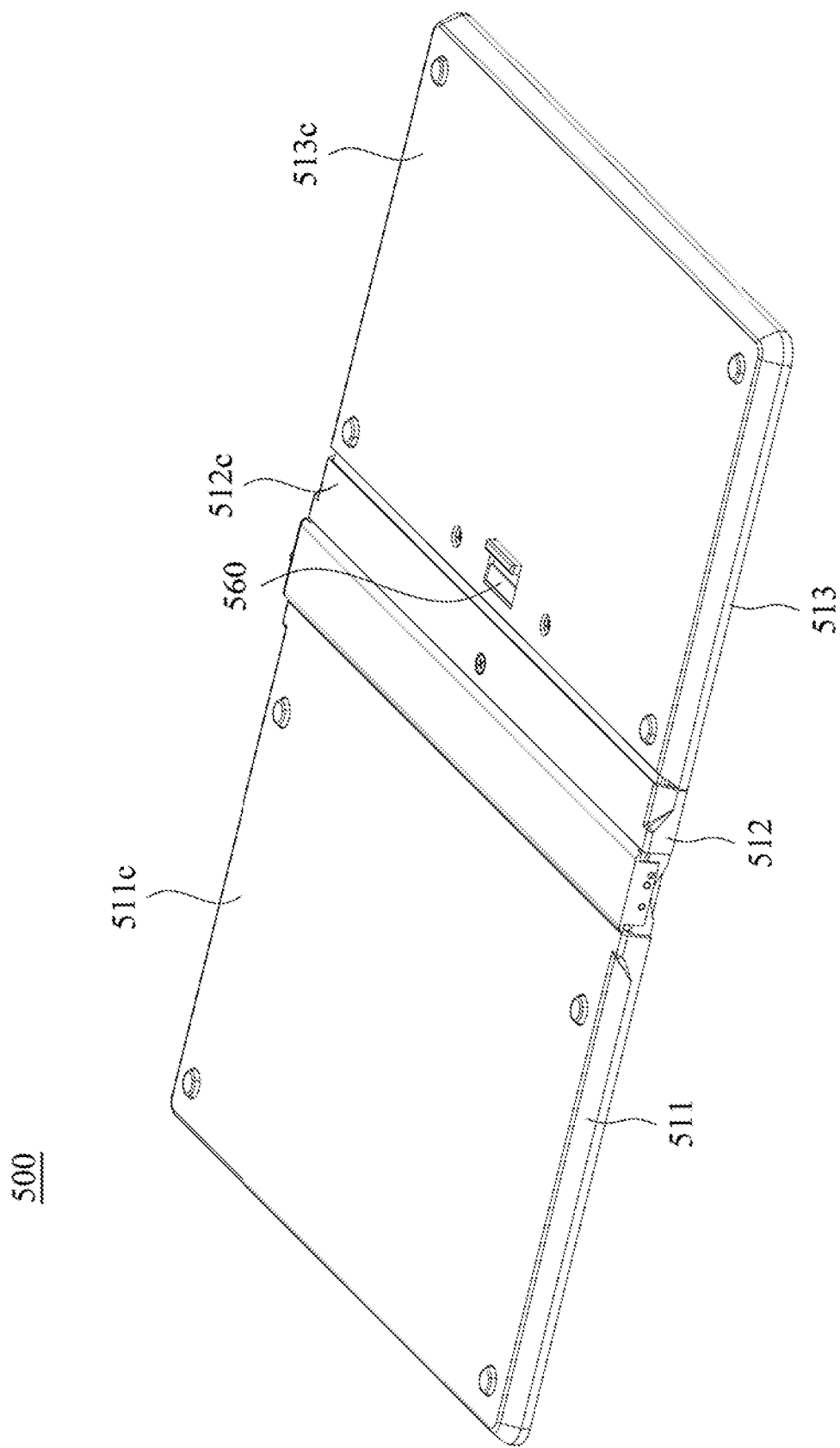
FIG. 6A is a schematic perspective view of the foldable display device in FIG. 5A from another viewing angle.
Figure 6B:
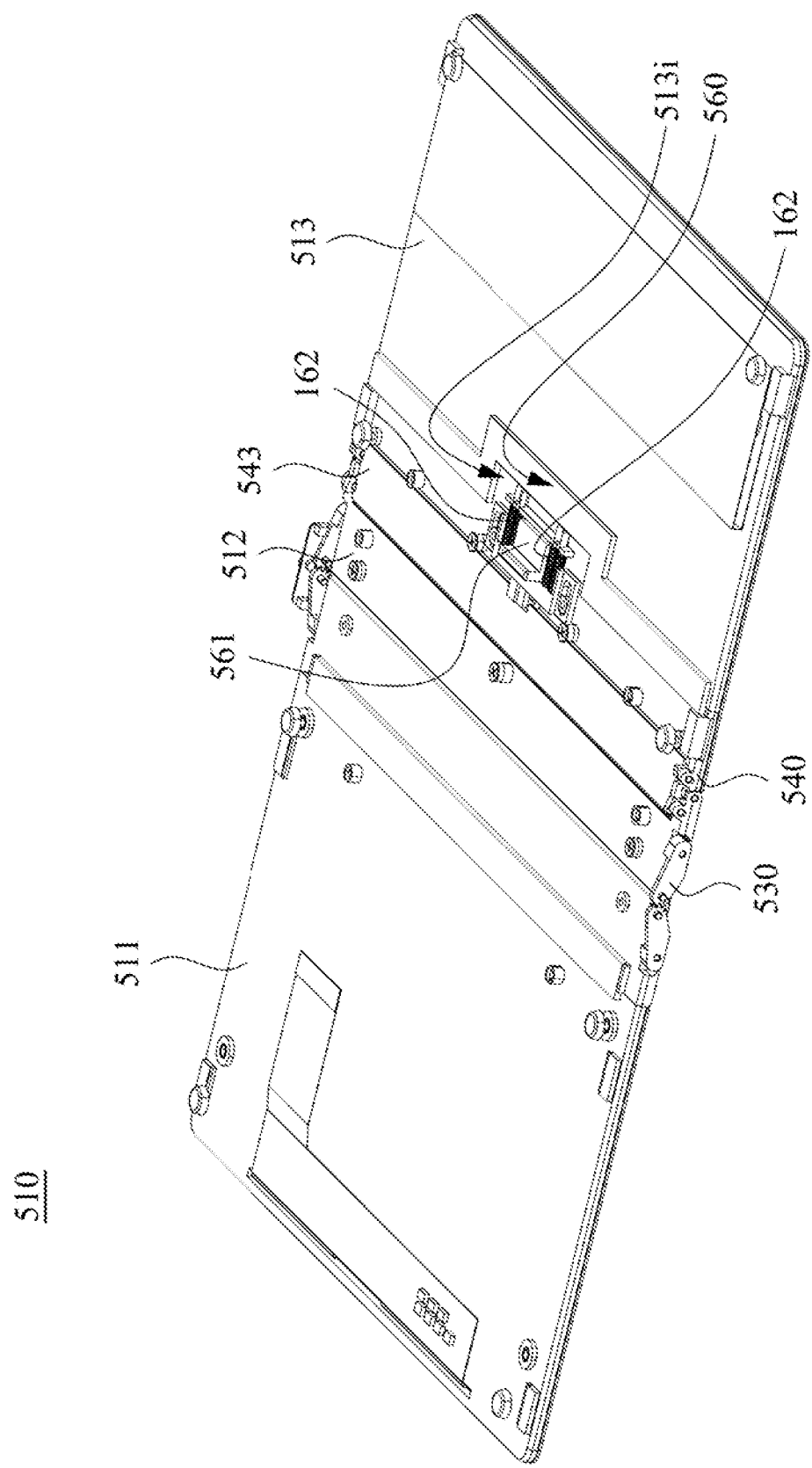
FIG. 6B is schematic perspective views of the supporting assembly in FIG. 6A by omitting some outer cases.

FIG. 6A is a schematic perspective view of the foldable display device 500 in FIG. 5A from another viewing angle (from backside), and FIG. 6B is schematic perspective views of the supporting assembly 510 in FIG. 6A by omitting some outer cases. Specifically, FIG. 6A depicts the bottom of the foldable display device 500, where the first body 511 includes an outer case 511c, the second body 512 includes an outer case 512c, and the third body 513 includes an outer case 513c. FIG. 6B omits the outer cases 511c, 512c, and 513c.

Referring to FIGS. 6A and 6B, the supporting assembly 510 further includes a blocking member 560 which includes a sliding part 561 and at least one restoration component 162. The support plate 543 is located between the second body 512 and the third body 513. The sliding part 561 is movably disposed to the third body 513, so that the sliding part 561 can be moved from the third body 513 to the support plate 543, and back to the third body 513. Moreover, the sliding part 561 can slide within the depression 513i of the third body 513.

In this preferred embodiment, the blocking member 560 can include a plurality of restoration components 162, in which each of the side-by-side restoration components 162 is connected to the sliding part 561. However, in other preferred embodiment, the blocking member 560 may include only one restoration component 162 connected to the sliding part 561. Hence, the quantity of the restoration component 162 included by the blocking member 560 may be only one and is not limited to two or more than two.

The restoration components 162 can also cause the sliding part 561 to move to the support plate 543, so that the sliding part 561 can extend from the third body 513 to the support plate 543 when the flattened foldable display device 500 is in the second state. When the sliding part 561 extends to the support plate 543, the sliding part 561 also can block the relative rotation between the support plate 543 and the third body 513. Hence, the sliding part 561 can stop the relative rotation between the second body 512 and the third body 513, so as to prevent a sudden fold of the foldable display device 500, thereby facilitating the smooth use of the foldable display device 500 when watching or reading the foldable display device 500.

Figure 6C:
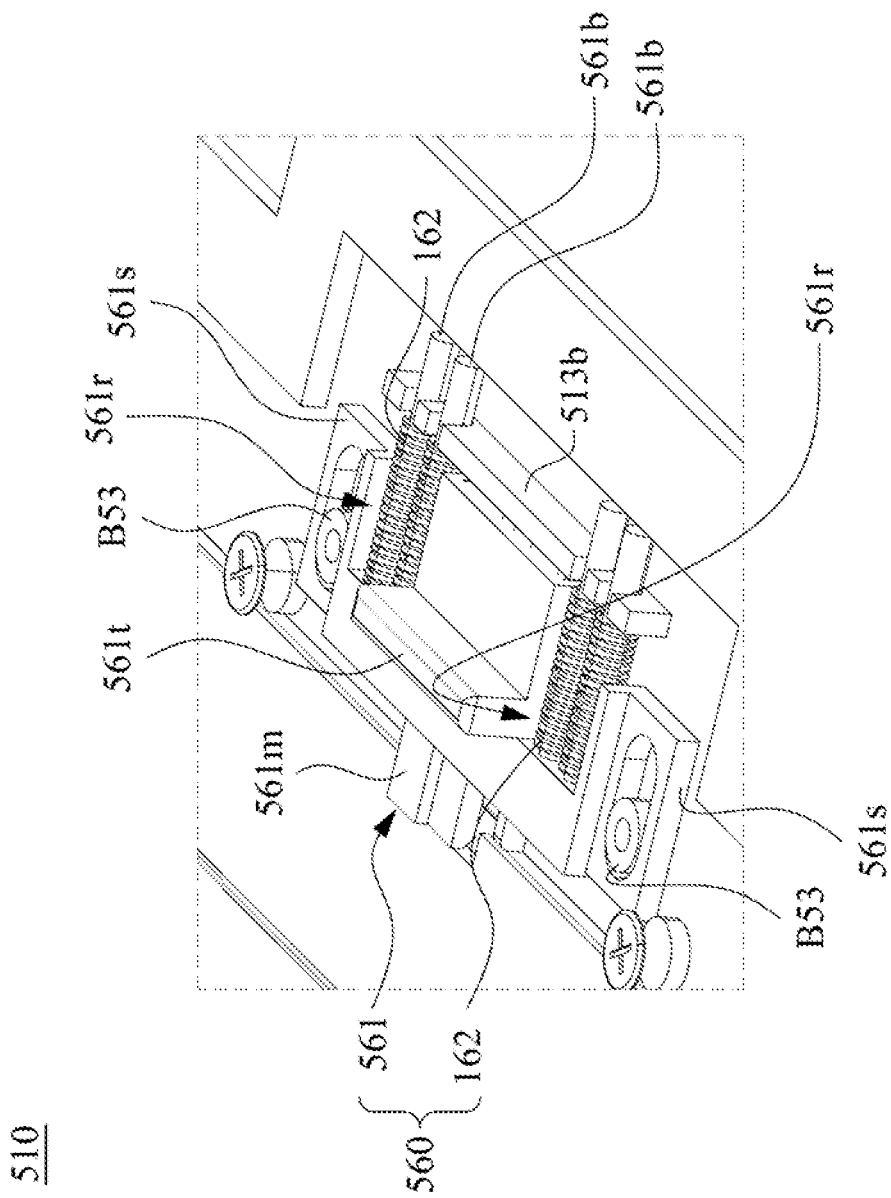
FIGS. 6C and 6D are schematic partial perspective views of the supporting assembly in FIG. 6B.
Figure 6D:
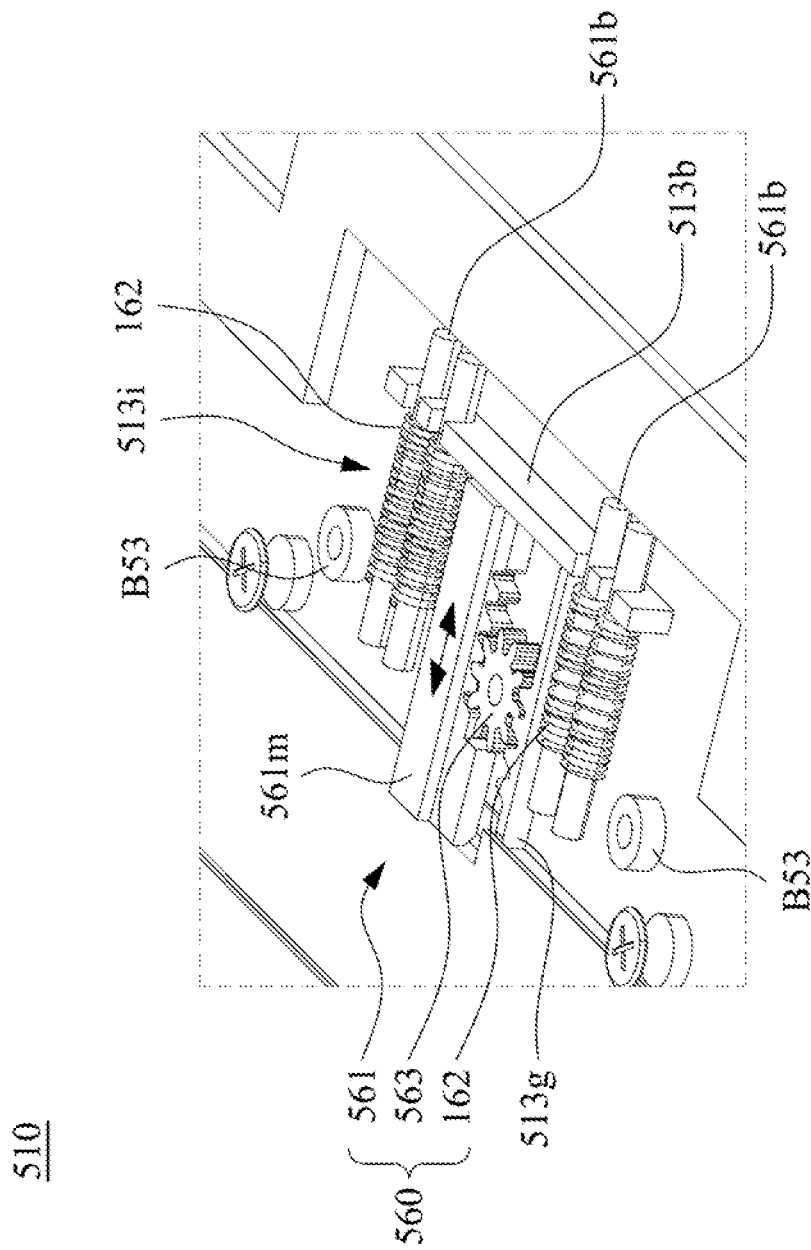

FIGS. 6C and 6D are schematic partial perspective views of the supporting assembly 510 in FIG. 6B, where FIG. 6D omits the part of the blocking member 560. Referring to FIGS. 6C and 6D, the blocking member 560 is different from the above blocking member 160. Specifically, the sliding part 561 can include a sliding strip 561m, a switching portion 561t, a plurality of bars 561b, and two extension sections 561s.

The sliding strip 561m is movably disposed to the third body 513. The switching portion 561t is connected to the extension sections 561s, the sliding strip 561m, and the bars 561b. When the switching portion 561t moves, all of the sliding strip 561m, the extension sections 561s, and the bars 561b will move with the switching portion 561t. Thus, the user can move the sliding strip 561m by moving the switching portion 561t, so as to control the movement and the position of the sliding strip 561m.

The switching portion 561t can have two recesses 561r, in which the recesses 561r are located between the two extension sections 561s. The bars 561b are connected to the switching portion 561t and located in the recesses 561r, as shown in FIG. 6C. Each of the bars 561b is inserted into one restoration component 162, where all of the bars 561b extend in the same direction and are arranged side by side.

The third body 513 may further have a stopping bump 513b and two restricting bumps B53. The stopping bump 513b and the restricting bumps B53 are located within the depression 513i. The stopping bump 513b having a plurality of grooves can limit and stop the movement of the sliding strip 561m. The bars 561b can pass through the grooves of the stopping bump 513b respectively and move relative to the stopping bump 513*b*. The restoration components 162 are restricted within the recesses 561*r*. The extension sections 561*s* have an opening apiece, in which the restricting bumps B53 are located in the openings respectively, so that the restricting bumps B53 can limit the movement of the sliding part 161.

Referring to FIG. 6D, unlike the above sliding part 161 and the third body 113, the blocking member 560 may further include a gear 563, and the third body 513 may further have a geared rack 513*g*, in which the geared rack 513*g* and the gear 563 can engage. The geared rack 513*g* can be located between the gear 563 and one of the bars 561*b*, while the gear 563 can be disposed between the sliding strip 561*m* and the geared rack 513*g*. In addition, the sliding strip 561*m* has a geared side, while the gear 563 and the geared side can engage, too. The gear 563 will move when the sliding strip 561*m* moves relative to the third body 513.

Figure 7A:
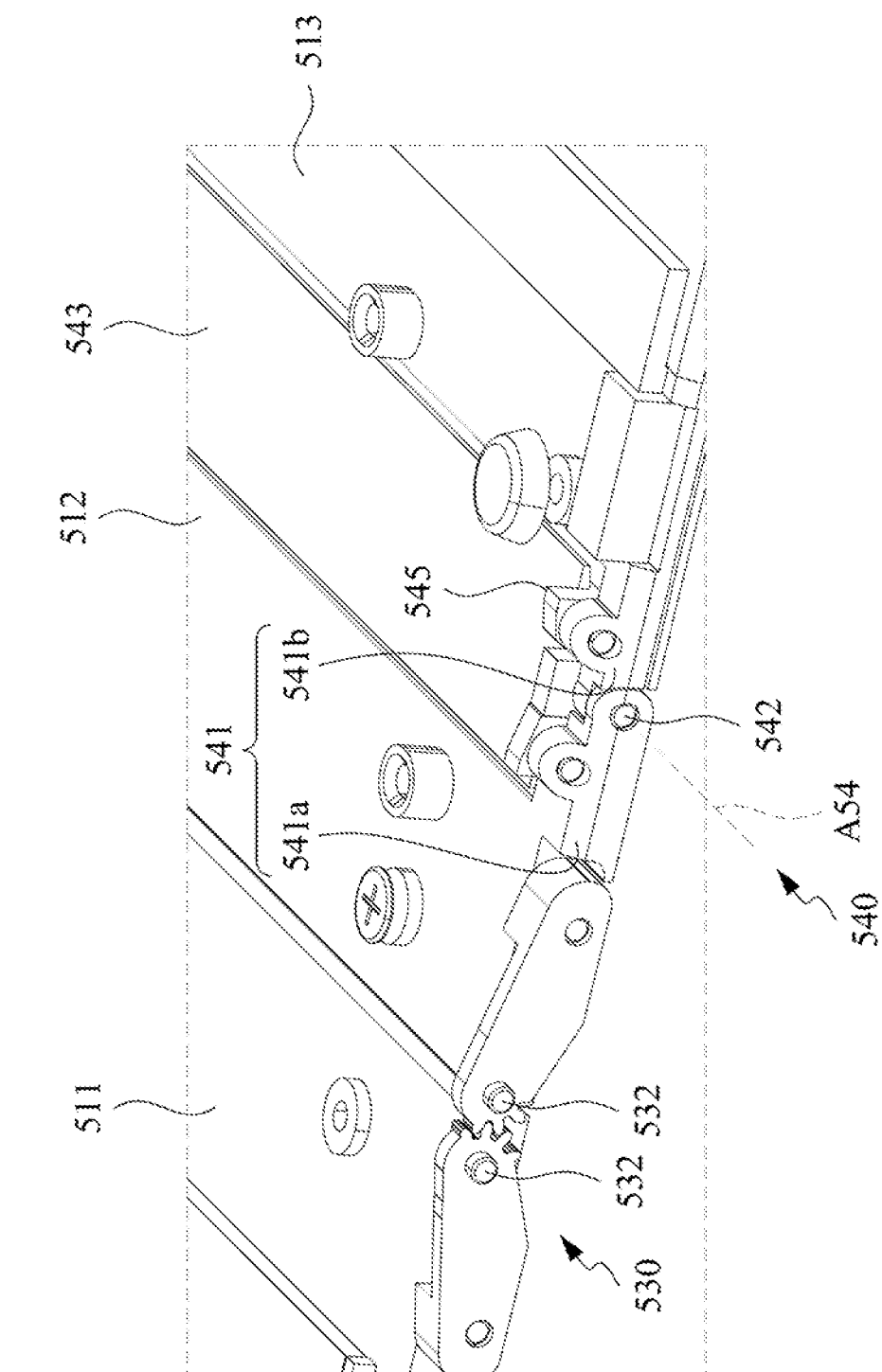
FIG. 7A is a schematic partial perspective view of the supporting assembly in FIG. 6B.
Figure 7B:
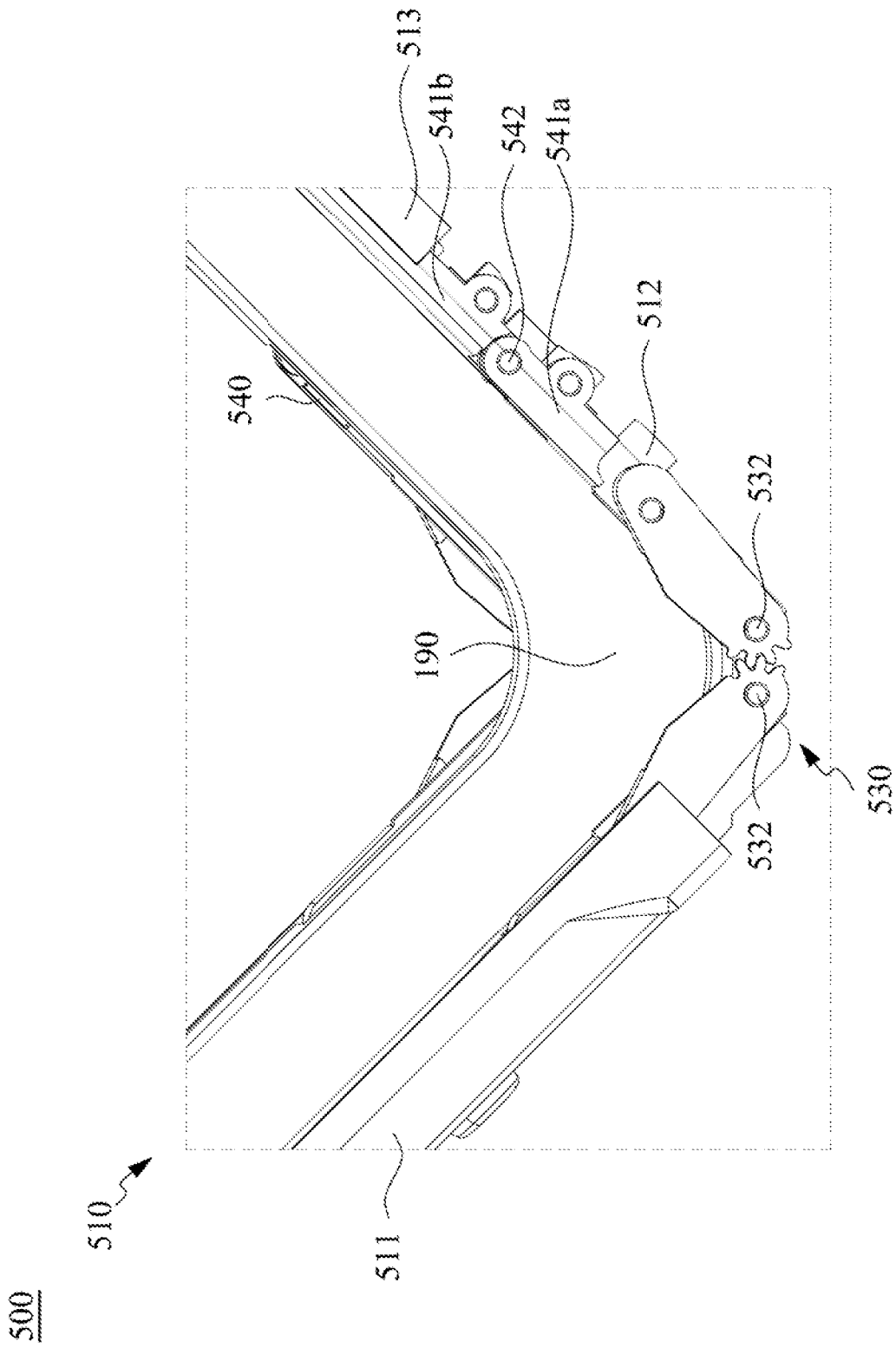
FIG. 7B is a schematic perspective view of folding the foldable display device in FIG. 5A.

FIG. 7A is a schematic partial perspective view of the supporting assembly 510 in FIG. 6B, and FIG. 7B is a schematic perspective view of folding the foldable display device 500 in FIG. 5A. Referring to FIGS. 7A and 7B, unlike the previous second hinge member 140, the second hinge member 540 further includes a pair of hinge parts 541 (on two opposite sides of the supporting assembly 510, as seen in FIG. 6B) and two shafts 542, where the support plate 543 is disposed between the pair of hinge parts 541, and the hinge parts 541 includes two link sections 541*a* and 541*b* apiece.

The link sections 541*a* and 541*b* of each of the hinge parts 541 are pivotally connected to each other and connected to the second body 512 and the third body 513 respectively. The shafts 542 on two opposite sides of the supporting assembly 510 (as seen in FIG. 6B) are disposed coaxially and opposite to each other. Each of the shafts 542 is connected to and passes through one of the hinge parts 541, so the link sections 541*a* and 541*b* of each of the hinge parts 541 can pivot relative to each other around the shafts 542. Therefore, the second body 512 and the third body 513 can pivot relative to each other around the second axis A54. In the present embodiment, the second body 512 and the third body 513 are designed as a single axis torque hinge. In addition, the support plate 543 has another two shafts which are linked to the link sections 541*a* and 541*b*.

It is noted that FIG. 7A depicts the partial inside of the supporting assembly 510 at the first hinge member 530 and the second hinge member 540, so that FIG. 7A shows only one shaft 542 and one hinge part 541 whereas the other shaft 542 and the other hinge part 541 are not shown in FIG. 7A. As seen in FIGS. 7A and 7B, the first hinge member 530 includes a plurality of shafts 532. The first body 511 and the second body 512 can pivot relative to each other around the shafts 532 by the first hinge member 530 when the flat foldable display device 500 is folding, but the second body 512 and the third body 513 can be still flattened at this time, as shown in FIG. 7B.

Figure 7C:
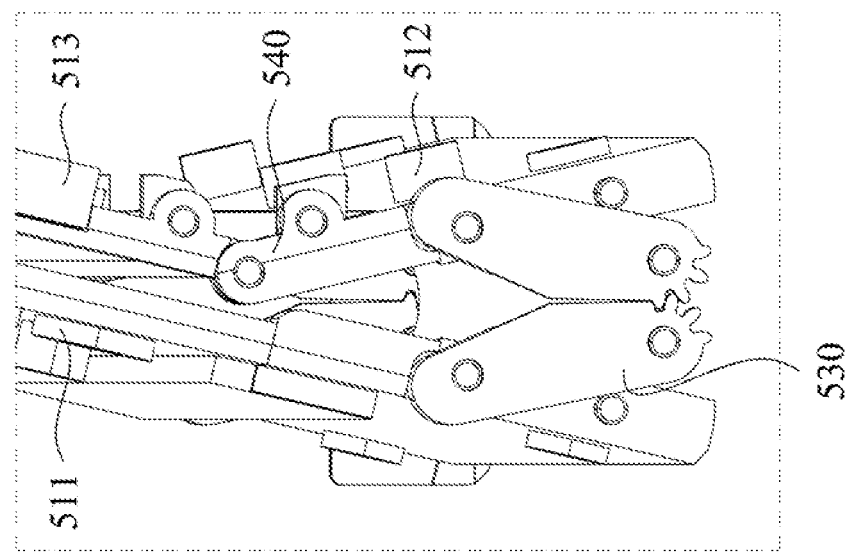
FIG. 7C is a schematic side elevation view of the folded supporting assembly in FIG. 7B in the first state.

FIG. 7C is a schematic side elevation view of the folded supporting assembly 510 in FIG. 7B in the first state, in which FIG. 7C mainly depicts the inside of the folded supporting assembly 510 in the first state. Referring to FIG. 7C, the foldable display device 500 and the supporting assembly 510 can be switched between the second state and the first state by the first hinge member 530 and the second hinge member 540. In the first state, the first body 511 and the third body 513 are disposed opposite to each other, and the first body 511 is adjacent to the third body 513. Like the previous supporting assembly 110, the folded supporting assembly 510 also has a P-shaped side, as shown in FIG. 7C.

Thus, the folded supporting assembly 510 also can avoid damaging the flexible display panel 190 and satisfy the convenient portable design for mobile apparatus.

Figure 7D:
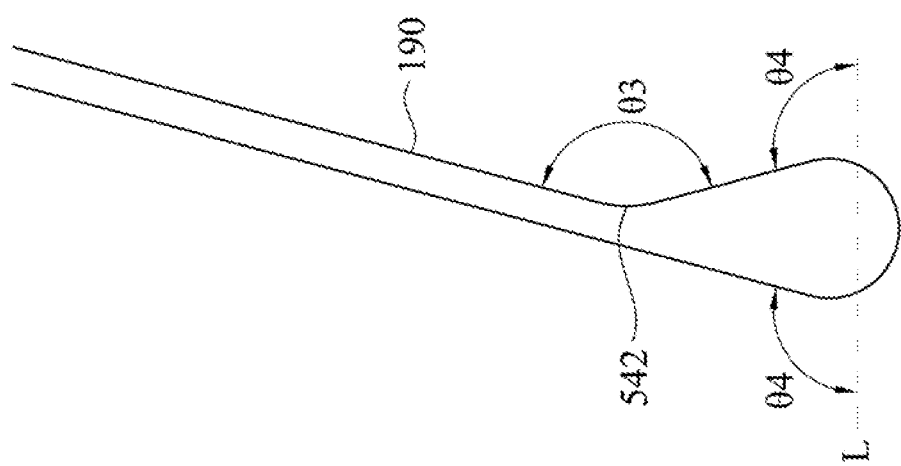
FIG. 7D is a schematic view of the flexible display panel in the first state.

FIG. 7D is a schematic view of the flexible display panel 190 in the first state, which is equivalent to the flexible display panel 190 of FIG. 7C without the supporting assembly 510, for example. Meanwhile, referring to FIGS. 7C and 7D, when the supporting assembly 510 of FIG. 7C is in the first state, a third included angle θ3 formed between two parts of the flexible display panel 190 respectively on the third body 513 and the second body 512 ranges between 145 and 165 degrees (such as 154 degrees), and a fourth included angle θ4 formed between a horizontal line L and a part of the flexible display panel 190 on any one of the first body 511 and the second body 512 ranges between 95 and 115 degrees (such as 103 degrees).

Figure 8:
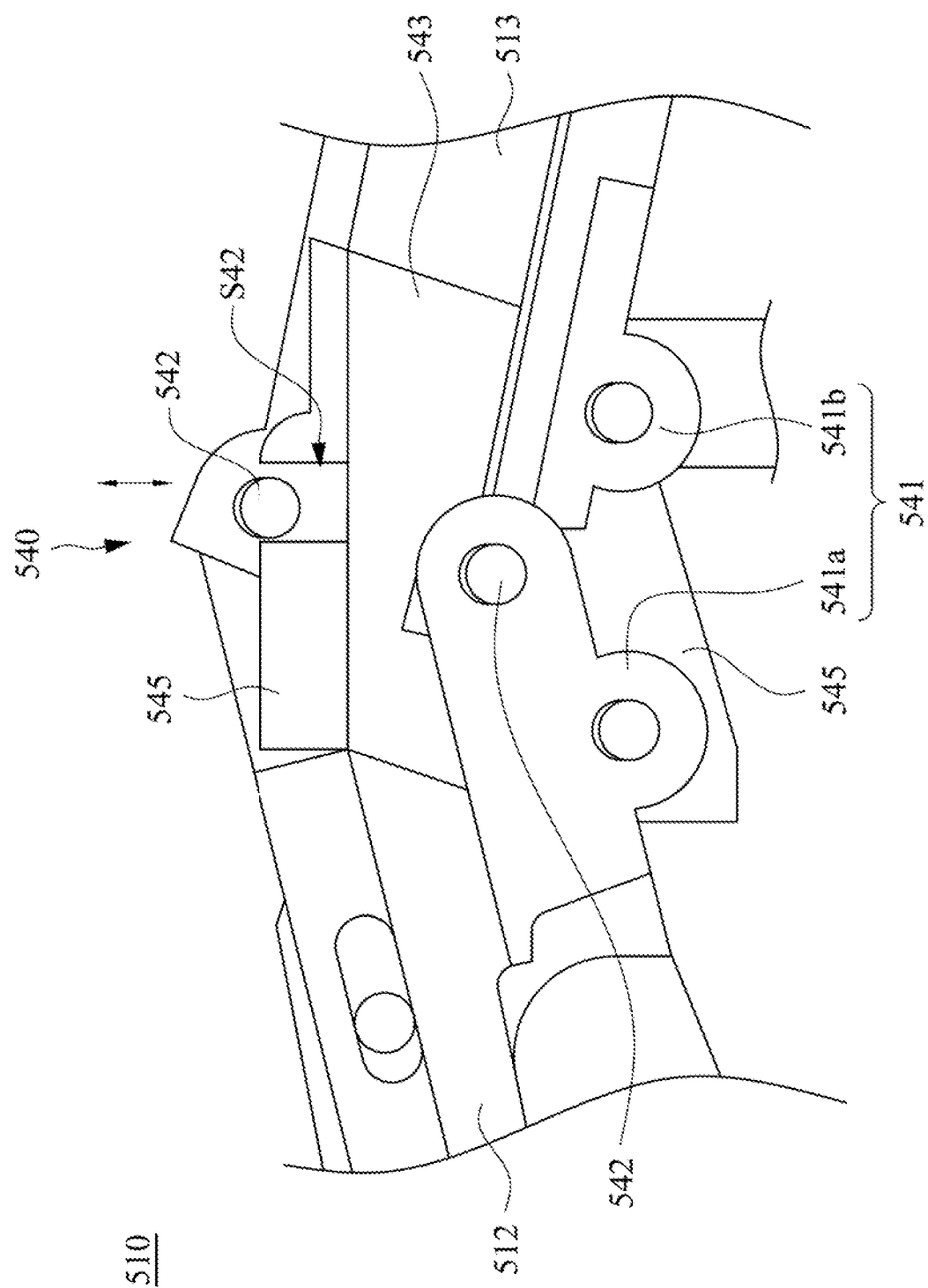
FIG. 8 is a schematic partial perspective view of folding the supporting assembly in FIG. 7A at the second hinge member.

FIG. 8 is a schematic partial perspective view of folding the supporting assembly 510 in FIG. 7A at the second hinge member 540. Referring to FIGS. 7A and 8, the second hinge member 540 may further include at least one guiding piece 545. In the preferred embodiment of FIG. 8, the second hinge member 540 includes two guiding pieces 545, in which the support plate 543 is connected to and located between the two guiding pieces 545. In other preferred embodiment, the second hinge member 540 may include only one guiding piece 545, so the quantity of the guiding piece 545 included by the second hinge member 540 is not limited to two.

The link sections 541*a* and 541*b* of the same hinge part 541 can be pivotally connected to one of the guiding pieces 545, so that each of the link sections 541*a* and 541*b* can pivot relative the guiding piece 545. In this preferred embodiment, each of guiding pieces 545 has a slot S42, in which all of the slots S42 extend in the direction away from the support plate 543. The shafts 542 and the slots S42 align respectively, so that each of the shafts 542 can enter one of the slots S42.

The shafts 542 can enter the slots S42 when the foldable display device 500 is in the second state, that is, the foldable display device 500 is flattened. At this time, the guiding pieces 545 can restrict the movement of the shafts 542, so as to prevent a sudden fold of the foldable display device 500. Conversely, the shafts 542 can leave the slots S42 when the foldable display device 500 is in the first state, that is, the foldable display device 500 is folded.

Consequently, the first hinge member is hinged to both the first body and the second body, and the second hinge member is hinged to both the second body and the third body, so that the first body, the second body, and the third body can pivot relative to each other via the first hinge member and the second hinge member. Thus, the foldable display device and the supporting assembly thereof can be folded and flattened. Therefore, the supporting assembly according to at least one preferred embodiment of the invention can provide a convenient portable design for mobile apparatus. The above foldable display device in the first state can be easy to be carried around.

Although the present invention has been described in considerable detail with reference to certain preferred embodiments thereof, other preferred embodiments are possible. Therefore, the spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A foldable display device, comprising:
   a supporting assembly, comprising:
      a first body, having a first surface;
      a second body, having a second surface;
      a first hinge member, hinged to both the first body and the second body;
      a third body, having a third surface;
      a fourth body, having a fourth surface, wherein the fourth body has hinged to and between the second body and the third body; and
      a second hinge member, hinged to both the second body and the third body; and
   a flexible display panel, disposed to the first surface, the second surface, and the third surface,
   wherein when the foldable display device is folded to be in a first state, the first surface, the second surface, the third surface, and the fourth surface are noncoplanar, the flexible display panel is folded, a first included angle is formed between two parts of the flexible display panel respectively on the third body and the second body form, and a second included angle is formed between a horizontal line and a part of the flexible display panel on any one of the first body and the second body,
   wherein the first surface, the second surface, the third surface, and the fourth surface are coplanar, and the flexible display panel is flattened when the foldable display device is flattened to be in a second state.

2. The foldable display device of claim 1, wherein a size of each of the second body and the third body is smaller than a size of the first body.

3. The foldable display device of claim 1, wherein a first gap is formed between the first surface and the second surface, and a second gap is formed between the first surface and the third surface when the foldable display device is in a first state;
   wherein a width of the first gap is greater than a width of the second gap.

4. The foldable display device of claim 3, wherein the width of the first gap gradually decreases from the first hinge member to the second hinge member.

5. The foldable display device of claim 1, wherein the foldable display device in the first state has a first thickness and a second thickness, and the first thickness is thinner than the second thickness,
   wherein the first thickness extends from the first body to the third body, and the second thickness extends from the first body to the second body.

6. The foldable display device of claim 1, wherein the supporting assembly in the first state has an acute included angle formed between the first surface and the second surface, and the acute included angle is opposite to the first hinge member.

7. The foldable display device of claim 1, wherein the flexible display panel has a gap width when the foldable display device is in the first state, and the gap width between the first surface and the third surface ranges between 1 mm and 4 mm.

8. The foldable display device of claim 1, wherein the second hinge member comprises:
   a pair of hinge parts, comprising two link sections apiece, wherein the link sections of each of the pair of hinge parts pivotally connected to each other are connected to the second body and the third body respectively, the fourth body is a support plate disposed between the pair of hinge parts; and
   two shafts, disposed coaxially and opposite to each other, wherein each of the shafts is connected to the link sections of one of the pair of hinge parts, and the link sections of each of the pair of hinge parts pivot relative to each other around the shafts.

9. The foldable display device of claim 8, wherein the second hinge member further comprises:
   at least one guiding piece, connected to the support plate and having a slot, wherein one of the shafts enters the slot when the foldable display device is in the second state,
   wherein one of the shafts leaves the slot when the foldable display device is in the first state.

10. The foldable display device of claim 1, wherein the second hinge member comprises:
    a pair of hinge parts, comprising a first piece and a second piece apiece, wherein the first piece has a protrusion, and the second piece has a recess,
    wherein the protrusion enters the recess when the foldable display device is in the second state,
    wherein the protrusion leaves the recess when the foldable display device is in the first state.

11. The foldable display device of claim 1, wherein the fourth body is located between the second surface and the third surface when the foldable display device is in the second state, the supporting assembly further comprising:
    a blocking member, comprising:
       a sliding part, movably disposed to the third body; and
       at least one restoration component connected to the sliding part, wherein the at least one restoration component causes the sliding part to move to the fourth body, so that the sliding part extends from the third body to the fourth body when the foldable display device is in the second state.

12. A supporting assembly, comprising:
    a first body, having a first surface;
    a second body, having a second surface;
    a first hinge member, hinged to both the first body and the second body;
    a third body, having a third surface;
    a fourth body, having a fourth surface, wherein the fourth body has hinged to and between the second body and the third body; and
    a second hinge member, hinged to both the second body and the third body;
    wherein the first surface, the second surface, the third surface, and the fourth surface are noncoplanar when the supporting assembly is folded to be in a first state,
    wherein the first surface, the second surface, the third surface, and the fourth surface are coplanar when the supporting assembly is flattened to be in a second state.

13. The supporting assembly of claim 12, wherein a size of each of the second body and the third body is smaller than a size of the first body.

14. The supporting assembly of claim 12, wherein a first gap is formed between the first surface and the second surface, and a second gap is formed between the first surface and the third surface when the supporting assembly is in a first state;
    wherein a width of the first gap is greater than a width of the second gap.

15. The supporting assembly of claim 14, wherein the width of the first gap gradually decreases from the first hinge member to the second hinge member.

16. The supporting assembly of claim 12, wherein the supporting assembly in the first state has a first thickness and a second thickness, and the first thickness is thinner than the second thickness,
wherein the first thickness extends from the first body to the third body, and the second thickness extends from the first body to the second body.

17. The supporting assembly of claim 12, wherein the supporting assembly in the first state has an acute included angle formed between the first surface and the second surface, and the acute included angle is opposite to the first hinge member.

18. The supporting assembly of claim 12, wherein the second hinge member comprises:
a pair of hinge parts, comprising two link sections apiece, wherein the link sections of each of the pair of hinge parts pivotally connected to each other are connected to the second body and the third body respectively, the fourth body is a support plate disposed between the pair of hinge parts; and
two shafts, disposed coaxially and opposite to each other, wherein each of the shafts is connected to the link sections of one of the pair of hinge parts, and the link sections of each of the pair of hinge parts pivots relative to each other around the shafts.

19. The supporting assembly of claim 18, wherein the second hinge member further comprises:
at least one guiding piece, connected to the support plate and having a slot, wherein one of the shafts enters the slot when the supporting assembly is in the second state,
wherein one of the shafts leaves the slot when the supporting assembly is in the first state.

20. The supporting assembly of claim 12, wherein the second hinge member comprises:
a pair of hinge parts, comprising a first piece and a second piece apiece, wherein the first piece has a protrusion, and the second piece has a recess,
wherein the protrusion enters the recess when the supporting assembly is in the second state,
wherein the protrusion leaves the recess when the supporting assembly is in the first state.

21. The supporting assembly of claim 12, wherein the fourth body is located between the second surface and the third surface when the supporting assembly is in the second state, the supporting assembly further comprising:
a blocking member, comprising:
a sliding part, movably disposed to the third body; and
at least one restoration component connected to the sliding part, wherein the at least one restoration component causes the sliding part to move to the fourth body, so that the sliding part extends from the third body to the fourth body when the supporting assembly is in the second state.

* * * * *